US011424425B2

(12) United States Patent
Park et al.

(10) Patent No.: US 11,424,425 B2
(45) Date of Patent: Aug. 23, 2022

(54) ELECTROLUMINESCENT DEVICE, AND DISPLAY DEVICE COMPRISING THEREOF

(71) Applicant: SAMSUNG ELECTRONICS CO., LTD., Suwon-si (KR)

(72) Inventors: Sujin Park, Seoul (KR); Yuho Won, Seoul (KR); Eun Joo Jang, Suwon-si (KR); Dae Young Chung, Suwon-si (KR); Sung Woo Kim, Hwaseong-si (KR); Jin A Kim, Suwon-si (KR); Yong Seok Han, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 127 days.

(21) Appl. No.: 17/062,162

(22) Filed: Oct. 2, 2020

(65) Prior Publication Data

US 2021/0104696 A1 Apr. 8, 2021

(30) Foreign Application Priority Data

Oct. 7, 2019 (KR) .................. 10-2019-0123994

(51) Int. Cl.
*H01L 51/50* (2006.01)
*H01L 51/00* (2006.01)

(52) U.S. Cl.
CPC ........ *H01L 51/502* (2013.01); *H01L 51/0037* (2013.01); *H01L 51/0039* (2013.01); *H01L 51/5056* (2013.01); *H01L 51/0007* (2013.01); *H01L 51/5072* (2013.01); *H01L 2251/5369* (2013.01); *H01L 2251/558* (2013.01)

(58) Field of Classification Search
CPC ............... H01L 51/502; H01L 51/0037; H01L 51/0039
See application file for complete search history.

(56) References Cited

U.S. PATENT DOCUMENTS

| | | | |
|---|---|---|---|
| 8,755,953 | B2 | 6/2014 | Phan et al. |
| 9,043,053 | B2 | 5/2015 | Phan et al. |
| 9,722,198 | B2 | 8/2017 | Murayama et al. |
| 10,396,306 | B2 | 8/2019 | Kim et al. |
| 2010/0103648 | A1 | 4/2010 | Kim et al. |

(Continued)

FOREIGN PATENT DOCUMENTS

| | | |
|---|---|---|
| JP | 6233417 | 11/2017 |
| KR | 1020090001907 A | 1/2009 |

(Continued)

*Primary Examiner* — Anthony Ho
(74) *Attorney, Agent, or Firm* — Cantor Colburn LLP

(57) ABSTRACT

An electroluminescent device includes a first electrode and a second electrode facing each other; a hole transport layer between the first electrode and the second electrode; a light emitting layer including a first light emitting layer disposed between the hole transport layer and the second electrode and including a first quantum dot and a second light emitting layer between the first light emitting layer and the second electrode and including a second quantum dot; and an electron transport layer between the light emitting layer and the second electrode. Each of the first and second light emitting layers emits first light, each of the first and second quantum dots has a core-shell structure including one or more shells, and the first and second quantum dots have different numbers of shells from each other or have different total thicknesses of the one or more shells from each other.

20 Claims, 9 Drawing Sheets

(56) References Cited

U.S. PATENT DOCUMENTS

2019/0081262 A1 3/2019 Kim et al.
2019/0280235 A1 9/2019 Kim et al.
2019/0326539 A1 10/2019 Chung et al.

FOREIGN PATENT DOCUMENTS

| KR | 101140309 B1 | 5/2012 |
| KR | 1020150014433 A | 2/2015 |
| KR | 1020160093429 A | 8/2016 |
| KR | 101695442 B1 | 1/2017 |
| KR | 1020190029470 | 3/2019 |
| KR | 1020190079111 | 7/2019 |
| KR | 1020190107506 A | 9/2019 |
| KR | 1020190110046 A | 9/2019 |

ELECTROLUMINESCENT DEVICE, AND DISPLAY DEVICE COMPRISING THEREOF

CROSS-REFERENCE TO RELATED APPLICATION

This application claims priority to Korean Patent Application No. 10-2019-0123994 filed on Oct. 7, 2019, and all the benefits accruing therefrom under 35 U.S.C. § 119, the content of which in its entirety is herein incorporated by reference.

BACKGROUND

1. Field

An electroluminescent device and a display device comprising thereof are disclosed.

2. Description of the Related Art

A quantum dot is a nanocrystal of a semiconductor material with a diameter of several nanometers to several tens of nanometers, which exhibits a quantum confinement effect. The quantum dot generates stronger light in a narrow wavelength region than commonly used phosphors. The quantum dot emits light while excited electron is transited from a conduction band to a valence band, and a wavelength of the emitted light is changed depending upon a particle size of the quantum dot even in the same material. As the quantum dot emits light of a shorter wavelength with a smaller particle size, the quantum dot may provide light in a desirable wavelength region by adjusting its size.

In other words, a light emitting layer including the quantum dots and various types of electronic devices including the same may generally save production costs, compared with an organic light emitting diode using a light emitting layer including a phosphorescent and/or fluorescent material, and desirable colors may be emitted by changing sizes of the quantum dots, without using other organic materials in the light emitting layer for emitting other color lights.

Luminous efficiency of the light emitting layer including the quantum dots is determined by quantum efficiency of the quantum dots, a balance of charge carriers, light extraction efficiency, and the like.

SUMMARY

Particularly, in order to improve the quantum efficiency, excitons may be confined in the light emitting layer, but when the excitons are not confined in the light emitting layer by a variety of factors, it may cause a problem such as exciton quenching.

An embodiment provides an electroluminescent device having improved life-span and/or luminous efficiency and a display device including the same.

According to an embodiment, an electroluminescent device includes a first electrode and a second electrode which face each other; a hole transport layer disposed between the first electrode and the second electrode; a light emitting layer including a first light emitting layer disposed between the hole transport layer and the second electrode and including a first quantum dot, and a second light emitting layer disposed between the first light emitting layer and the second electrode and including a second quantum dot; and an electron transport layer disposed between the light emitting layer and the second electrode, where each of the first light emitting layer and the second light emitting layer emits first light, each of the first quantum dot and the second quantum dot has a core-shell structure, the core-shell structure includes one or more shells, and the first quantum dot and the second quantum dot have different numbers of shells from each other or have different total thicknesses of the one or more shells from each other.

The core may include a first semiconductor nanocrystal and the shell may include a second semiconductor nanocrystal having a composition different from a composition of the first semiconductor nanocrystal.

The first semiconductor nanocrystal and the second semiconductor nanocrystal may independently include a Group II-VI compound that does not include Cd, a Group III-V compound, a Group IV-VI compound, a Group IV element or compound, a Group compound, a Group I-II-IV-VI compound that does not include Cd, or a combination thereof.

The number of shells of the first quantum dot may be less than the number of shells of the second quantum dot.

The first quantum dot may have a core-single shell structure and the second quantum dot may include a core-multiple shell structure.

Hole transport capability per unit area of the first quantum dot may be greater than hole transport capability per unit area of the second quantum dot, and electron transport capability per unit area of the first quantum dot is greater than electron transport capability per unit area of the second quantum dot.

The total thickness of the one or more shells in the first quantum dot may be greater than the total thickness of the one or more shells in the second quantum dot.

The total thickness of the one or more shells in the first quantum dot may be about 1 nanometers (nm) to about 15 nm, and the total thickness of the one or more shells in the second quantum dot may be about 1 nm to about 10 nm.

Each of the first quantum dot and the second quantum dot may have a core-multishell structure, and a thickness of an outermost shell of the multishells of the first quantum dot may be greater than a thickness of an outermost shell of the multishells of the second quantum dot.

The first quantum dot may have lower electron transport capability than the second quantum dot.

Hole transport capability per unit area of the first quantum dot may be greater than or equal to hole transport capability per unit area of the second quantum dot, and electron transport capability per unit area of the first quantum dot may be less than or equal to electron transport capability per unit area of the second quantum dot.

The first light may belong to any one of a first wavelength region of about 380 nm to about 489 nm, a second wavelength region of about 490 nm to about 510 nm, a third wavelength region of about 511 nm to about 581 nm, a fourth wavelength region of about 582 nm to about 610 nm, and a fifth wavelength region of about 611 nm to about 680 nm.

A ligand including a compound derived from a metal halide, a compound derived from a carboxylic acid, a compound derived from a thiol, or a combination thereof may be attached to a surface of each of the first quantum dot and the second quantum dot.

Each of the first light emitting layer and the second light emitting layer may have an average thickness of about 5 nm to about 30 nm.

An average thickness of the first light emitting layer may be greater than or equal to an average thickness of the second light emitting layer.

The hole transport layer may include a poly(3,4-ethylene-dioxythiophene) derivative, a poly(styrenesulfonate) derivative, a poly-N-vinylcarbazole derivative, a polyphenylenevinylene derivative, a polyparaphenylenevinylene derivative, a polymethacrylate derivative, a polyarylamine derivative, a polyaniline derivative, a polypyrrole derivative, a poly(9,9-dioctylfluorene) derivative, a poly(spiro-bifluorene) derivative, tris(4-carbazol-9-yl phenyl)amine ("TCTA"), N,N'-diphenyl-N,N'-bis(3-methylphenyl)-(1,1'-biphenyl)-4,4'-diamine ("TPD"), N,N'-di(naphthalen-1-yl)-N-N'-diphenyl-benzidine ("NPB"), tris(3-methylphenylphenylamino)-triphenylamine ("m-MTDATA"), dipyrazino[2,3-f:2',3'-h]quinoxaline-2,3,6,7,10,11-hexacarbonitrile ("HAT-CN"), poly-TPD, NiO, $MoO_3$, or a combination thereof.

The electron transport layer may include inorganic material nanoparticles, quinolone-based compounds, triazine-based compounds, quinoline-based compounds, triazole-based compounds, naphthalene-based compounds, or a combination thereof.

The electron transport layer may include a cluster layer composed of inorganic material nanoparticles.

A hole injection layer may be further included between the first electrode and the hole transport layer.

According to another embodiment, a display device including the electroluminescent device is provided.

An electroluminescent device having improved life-span and/or luminous efficiency and life-span and a display device including the same are provided.

DETAILED DESCRIPTION

Figure 1:
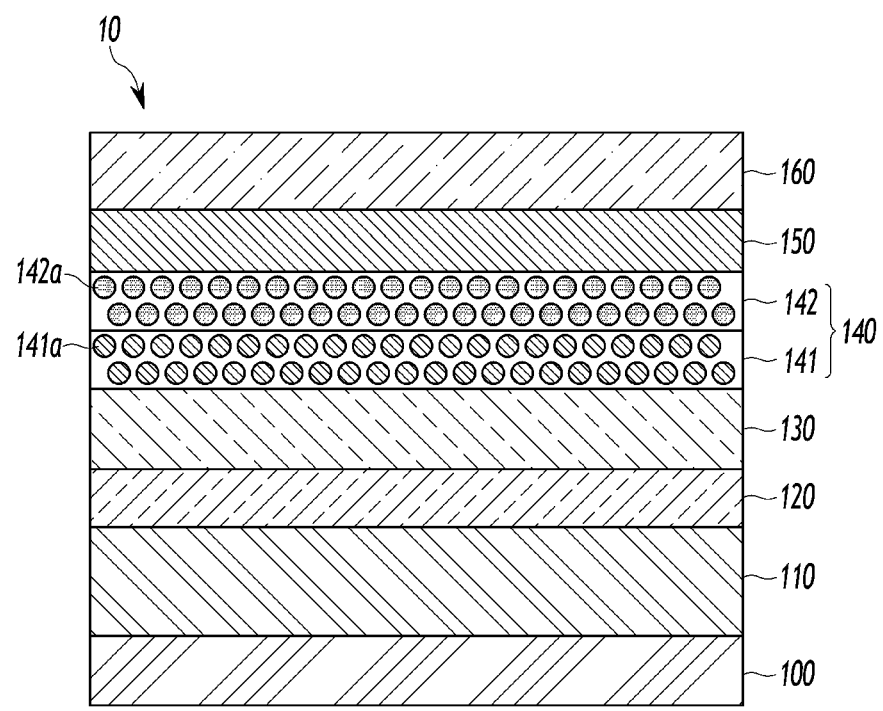
FIG. 1 is a schematic cross-sectional view of an electroluminescent device according to an embodiment.

Example embodiments of the present disclosure will hereinafter be described in detail, and may be easily performed by a person having an ordinary skill in the related art. However, this disclosure may be embodied in many different forms, and is not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

As used herein, when a definition is not otherwise provided, "thickness" refers to "an average thickness". The "average thickness" means an arithmetic mean value of thicknesses of measurement objects (e.g., layers, etc.) obtained from scanning electron microscope images at random from several times to several tens of times.

As used herein, for an average diameter of a particle in the present disclosure, although it may be digitized by a measurement to show an average size of a group, the generally used method includes a mode diameter showing the maximum value of the distribution, a median diameter corresponding to the center value of integral distribution curve, a variety of average diameters (numeral average, length average, area average, mass average, volume average, etc.), and the like. As used herein, unless particularly mentioning otherwise, an average particle diameter means to a numeral average diameter in the present disclosure, and it is obtained by measuring D50 (particle diameter at a position of distribution rate of 50 percentages (%)).

As used herein, "Group" refers to a group of Periodic Table.

As used herein, "Group II" refers to Group IIA and Group IIB, and examples of Group II metal may be Cd, Zn, Hg, and Mg, but are not limited thereto.

As used herein, examples of "Group II metal that does not include Cd" refers to a Group II metal except Cd, for example, Zn, Hg, Mg, etc.

As used herein, "Group III" refers to Group IIIA and Group IIIB, and examples of Group III metal may be Al, In, Ga, and Tl, but are not limited thereto.

As used herein, "Group IV" refers to Group IVA and Group IVB, and examples of a Group IV metal may be Si, Ge, and Sn, but are not limited thereto. As used herein, the term "metal" may include a semi-metal such as Si.

As used herein, "Group I" refers to Group IA and Group IB, and examples may include Li, Na, K, Rb, and Cs, but are not limited thereto.

As used herein, "Group V" refers to Group VA, and examples may include nitrogen, phosphorus, arsenic, antimony, and bismuth, but are not limited thereto.

As used herein, "Group VI" refers to Group VIA, and examples may include sulfur, selenium, and tellurium, but are not limited thereto.

An electroluminescent device including quantum dots (hereinafter referred to as a quantum dot electroluminescent device) are attracting attention as a next generation display device due to high color reproducibility of quantum dots and ease of solution processing.

However, in the quantum dot electroluminescent device, the flow of holes in the light emitting layer including the quantum dots in general is not smooth compared with the flow of electrons in the electric field of a constant intensity. Accordingly, the quantum dot electroluminescent device may require improvement in the following matters.

For example, charges (electrons, holes) injected toward the light emitting layer tend to be recombined mainly on the interface of the hole transport layer and the light emitting layer or inside of the hole transport layer and/or the light emitting layer near the interface. Herein, excitons inside the quantum dot electroluminescent device may be trapped and quenched by several energy levels generated on the interface of the hole transport layer and the light emitting layer and/or in an internal conduction band of the hole transport layer and/or the light emitting layer near the interface.

Alternatively, the injected electrons and holes may be recombined not in the light emitting layer but in a non-light emitting layer (e.g., the hole transport layer) and thus form excitons. Herein, the excitons formed in the non-light emitting layer do not contribute to light emission of the device but are quenched and thus may deteriorate efficiency of the quantum dot electroluminescent device.

Alternatively, excess electrons not recombined among the injected electrons and holes are continuously present on the interface of the hole transport layer and the light emitting layer, and thus may cause deterioration of materials included in the light emitting layer and/or the hole transport layer. In addition, the excess electrons may cause surface defects of the interface of the hole transport layer and/or the light emitting layer. These surface defects may quench the excitons and in addition, accelerate deterioration of the device, when driven at a constant current.

Accordingly, the present inventors researched on a method of securing a stable hole-electron balance inside the quantum dot electroluminescent device and confining excitons in the light emitting layer, and thus improving luminous efficiency and life-span characteristics of the device.

As a result, the present inventors discovered that a stable hole-electron balance in the device may be secured, and also a recombination position of electrons and holes may be adjusted into the light emitting layer to realize excellent luminous efficiency and life-span characteristics, by configuring the light emitting layer of the quantum dot electroluminescent device as a dual layer and configuring the quantum dots of each layer to have a different core-shell structure, for example, such that the number of shells and/or the total thickness of the shells are different from each other.

Thus, referring to FIG. 1, a schematic configuration of an electroluminescent device according to an embodiment is described.

FIG. 1 is a cross-sectional view schematically showing an electroluminescent device according to an embodiment.

An electroluminescent device 10 according to an embodiment includes a first electrode 110 and a second electrode 160 facing each other, a hole transport layer 130 disposed between the first electrode 110 and the second electrode 160, a hole injection layer 120 that is disposed between the first electrode 110 and the hole transport layer 130 and is optionally omitted in consideration of the relationship with each constituent element, a light emitting layer 140 disposed between the hole transport layer 130 and the second electrode 160, and an electron transport layer 150 disposed between the light emitting layer 140 and the second electrode 160.

In an embodiment, the light emitting layer 140 may include a first light emitting layer 141 disposed between the hole transport layer 130 and the second electrode 160 and including first quantum dots 141a, and a second light emitting layer 142 disposed between the first light emitting layer 141 and the second electrode 160 and including second quantum dots 142a.

That is, the electroluminescent device 10 has a stacked structure in which the hole injection layer 120, the hole transport layer 130, the light emitting layer 140 including the first light emitting layer 141 and the second light emitting layer 142, and the electron transport layer 150 are sequentially disposed between the first electrode 110 and the second electrode 160.

In an embodiment, the first electrode 110 may be directly connected to a driving power source such that the first electrode 110 may function to flow current to the light emitting layer 140. The first electrode 110 may include a material having high light transmittance in at least visible light wavelength region, but the invention is not limited thereto. In another embodiment, the first electrode 110 may include a material having high light transmittance in an infrared or ultraviolet ("UV") wavelength region. For example, the first electrode 110 may be an optically transparent material.

In an embodiment, the first electrode 110 may include molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

However, the first electrode 110 according to an embodiment is not necessarily limited thereto but may include a material further having high light transmittance with respect to light in an infrared or ultraviolet (UV) wavelength region or a semi-permeable material selectively transmitting light in a particular wavelength region or may conduct a function of reflecting light in a visible light wavelength region and turning it back toward the second electrode 160.

In an embodiment, the first electrode 110 may be disposed on the substrate 100 as shown in FIG. 1. The substrate 100 may be a transparent insulating substrate or may be made of or include a ductile material. The substrate 100 may include glass or polymer material of a film having a glass transition temperature of greater than about 150 degrees Celsius (° C.). For example, it includes a COC (cyclo olefin copolymer) or COP (cyclo olefin polymer) based material.

In an embodiment, the substrate 100 may support the hole injection layer 120, the transport layer 130, the light emitting layer 140, and the electron transport layer 150 disposed between the first electrode 110 and the second electrode 160. However, the substrate 100 of the electroluminescent device 10 according to an embodiment may not be disposed under the first electrode 110, but the substrate 100 may be disposed on the second electrode 160 or may be omitted.

The second electrode 160 includes an optically transparent material and may function as a light-transmitting electrode to transmit light generated in the light emitting layer 140. In an embodiment, the second electrode 160 may include at least one selected from silver (Ag), aluminum (Al), copper (Cu), gold (Au), and an alloy thereof, molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

However, the second electrode 160 according to an embodiment is not limited thereto but may include a semi-permeable material selectively transmitting light in a particular wavelength region, or conduct a function of reflecting light in a visible light wavelength region and turning it back toward the first electrode 110 in another embodiment.

When the second electrode 160 functions as a reflecting electrode, the first electrode 110 may be a light-transmitting electrode formed of or include a material transmitting light in at least visible light wavelength region or a semi-permeable electrode selectively transmitting light in a particular wavelength region.

Each of the first electrode 110 and the second electrode 160 may be formed by depositing a material for forming an electrode on the substrate 100 or an organic layer by a method such as sputtering.

As shown in FIG. 1, an electroluminescent device 10 according to an embodiment may have a structure where the substrate 100 and each of constituent elements are disposed in the above stack order.

However, the electroluminescent device 10 according to an embodiment is not necessarily limited thereto but may have various structures within a range of satisfying the aforementioned order of disposing each constituent element. For example, when the substrate 100 is disposed not beneath the first electrode 110 but on the second electrode 160, the electroluminescent device 10 may have an inverted structure.

The hole injection layer 120 may be disposed between the first electrode 110 and the second electrode 160, for example, between the first electrode 110 and the hole transport layer 130 that will be described later, for example, directly on the first electrode 110. The hole injection layer 120 may supply holes into the light emitting layer 140 together with the hole transport layer 130. However, the hole injection layer 120 may be omitted considering the thickness and the material of the hole transport layer 130.

The hole injection layer 120 may be formed of or include a p-type semiconductor or a material doped with a p-type semiconductor. Examples of the hole injection layer 120 may include poly(3,4-ethylenedioxythiophene) ("PEDOT") or a derivative thereof, poly(styrene sulfonate) ("PSS") or a derivative thereof, poly-N-vinylcarbazole ("PVK") or a derivative thereof, polyphenylenevinylene or a derivative thereof, polyparaphenylenevinylene ("PPV") or a derivative thereof, polymethacrylate or a derivative thereof, poly(9,9-dioctylfluorene) or a derivative thereof, poly(spiro-bifluorene) or a derivative thereof, tris(4-carbazol-9-yl phenyl) amine (TCTA), N,N'-diphenyl-N,N'-bis(3-methylphenyl)-(1,1'-biphenyl)-4,4'-diamine (TPD), N,N'-di(naphthalen-1-yl)-N-N'-diphenyl-benzidine (NPB), tris(3-methylphenylphenylamino)-triphenylamine (m-MTDATA), dipyrazino[2,3-f:2',3'-h]quinoxaline-2,3,6,7,10,11-hexacarbonitrile (HAT-CN), poly-TPD, a metal oxide such as NiO or $MoO_3$, or a combination thereof, but the invention is not necessarily limited thereto.

The hole transport layer 130 may be disposed between the first electrode 110 and the second electrode 160, for example, on the first electrode 110, for example, on the first electrode 110 and the hole injection layer 120. The hole transport layer 130 may provide and transport holes into the light emitting layer 140. The hole transport layer 130 may be formed directly under the light emitting layer 140, and specifically under the first light emitting layer 141 to directly contact the light emitting layer 140.

In an embodiment, the hole transport layer 130 may include a material having a hole transporting property. The material having the hole transporting property may be a p-type semiconductor, or a material doped with a p-type semiconductor. The material having the hole transporting property is not limited to a specific material but may be a polymer, an oligomer, a metal oxide, or a combination thereof.

Examples of the material having the hole transporting property may include a poly(3,4-ethylenedioxythiophene) derivative, a poly(styrene sulfonate) derivative, a poly-N-vinylcarbazole derivative, a polyphenylenevinylene derivative, a polyparaphenylenevinylene derivative, a polymethacrylate derivative, a polyarylamine derivative, a polyaniline derivative, a polypyrrole derivative, a poly(9,9-dioctylfluorene) derivative, a poly(spiro-bifluorene) derivative, tris(4-carbazol-9-yl phenyl)amine (TCTA), N,N'-diphenyl-N,N'-bis(3-methylphenyl)-(1,1'-biphenyl)-4,4'-diamine (TPD), N,N'-di(naphthalen-1-yl)-N-N'-diphenyl-benzidine (NPB), tris(3-methylphenylphenylamino)-triphenylamine (m-MTDATA), dipyrazino[2,3-f:2',3'-h]quinoxaline-2,3,6,7,10,11-hexacarbonitrile (HAT-CN), poly-TPD, NiO, $MoO_3$, or a combination thereof, but the invention is not necessarily limited thereto.

In an embodiment, a thickness of the hole transport layer 130 may be varied in consideration of hole-electron balance with the hole injection layer 120, the hole transport layer 130, and/or the light emitting layer 140 in the device 10. The thickness of the hole transport layer 130 may be, for example, greater than or equal to about 10 nanometers (nm), for example, greater than or equal to about 15 nm, or greater than or equal to about 20 nm and for example, less than or equal to about 80 nm, less than or equal to about 70 nm, less than or equal to about 60 nm, or less than or equal to about 50 nm, for example, about 10 nm to about 80 nm, about 10 nm to about 70 nm, about 10 nm to about 60 nm, about 10 mm to about 50 nm, about 10 nm to about 40 nm, or about 20 nm to about 40 nm.

For example, the hole transport layer 130 may be formed in a wet coating method such as spin coating and the like. For example, both of the hole transport layer 130 and the light emitting layer 140, and specifically hole transport layer 130 and the first light emitting layer 141 may be formed in a wet coating method. In this way, the hole transport layer 130 and/or the first light emitting layer 141 may be formed in a simple process.

In addition, in an embodiment, the hole transport layer 130 and the first light emitting layer 141 may be made of or include materials having relatively different solubilities. For example, the hole transport layer 130 may be prepared using a material having excellent solubility for an aromatic non-polar solvent, while the first light emitting layer 141 may be prepared using a material having excellent solubility for an aliphatic non-polar solvent. Accordingly, even though the hole transport layer 130 and the first light emitting layer 141 are directly contacted using a solution process, the first light emitting layer 141 may be formed without surface damage of the hole transport layer 130, due to the different solubilities of the hole transport layer 130 and the first light emitting layer 141.

In an embodiment, for example, when a poly[(9,9-dioctylfluorene-2,7-diyl)-co-(4,4'-(N-4-butylphenyl)diphenylamine)] ("TFB") polymer film is formed as the hole transport layer 130, a precursor solution including a TFB precursor polymer and an aromatic non-polar solvent (e.g., toluene, xylene, etc.) is spin-coated on the first electrode 110 or the hole injection layer 120, thermal treatment is performed in an inert gas atmosphere of $N_2$ or in a vacuum at a temperature of about 150° C. to about 1800° C. for about 30 minutes to form a hole transport layer 130 made of TFB, and the first light emitting layer 141 may be easily formed thereon using an aliphatic non-polar solvent (for example, octane, nonane, cyclohexane, etc.) using a solution process.

As such, when the hole transport layer 130 and the first light emitting layer 141 are configured to have different relative solubilities, the formation of the hole transport layer 130 and the first light emitting layer 141 using a solution process is more easily performed, and the surface damage of the hole transport layer 130 by organic solvents may be minimized during the subsequent formation of the first light emitting layer 141.

The light emitting layer 140 may be disposed between the hole transport layer 130 and the second electrode 160, for example, disposed on the hole transport layer 130, for example, directly disposed on the hole transport layer 130, and may include quantum dots.

In an embodiment, the light emitting layer 140 may include the first light emitting layer 141 and the second light emitting layer 142 as described above. In an embodiment, each of the first light emitting layer 141 and the second light emitting layer 142 may include quantum dots. Hereinafter, the quantum dots included in the first light emitting layer 141 is referred to as first quantum dots 141a, and the quantum dots included in the second light emitting layer 142 is referred to as second quantum dots 142a.

The light emitting layer 140 is a site where electrons and holes transported by a current supplied from the first electrode 110 and the second electrode 160 are combined, the electrons and holes are combined in the light emitting layer 140 to generate excitons, and the generated excitons are transited from an exited state to a ground state to emit light in a wavelength corresponding to the size of the quantum dot. That is, the quantum dots may endow the light emitting layer 140 with an electro-luminescence function.

Particularly, since the quantum dots have a discontinuous energy bandgap by the quantum confinement effect, incident light may be converted into light having a particular wavelength and then radiated. Accordingly, the light emitting layer 140 including the quantum dots may produce light having excellent color reproducibility and color purity.

In an embodiment, the light emitting layer 140 may emit light belonging to a predetermined wavelength region by the quantum dot. In an embodiment, each of the first light emitting layer 141 and the second light emitting layer 142 may emit first light. That is, the first and second light emitting layers 141 and 142 may emit light (i.e., first light) belonging to the same wavelength region. In an embodiment, the first light may be a wavelength region belonging to an ultraviolet light region and/or a visible light region, for example, a wavelength region belonging to the visible light region. The first light may belong to, for example, one of a first wavelength region of about 380 nm to about 489 nm, a second wavelength region of about 490 nm to about 510 nm, a third wavelength region of about 511 nm to about 581 nm, a fourth wavelength region of about 582 nm to about 610 nm, and a fifth wavelength region of about 620 nm to about 680 nm.

In an embodiment, each of the first quantum dots 141a and the second quantum dots 142a may emit blue light belonging to a first wavelength region of about 380 nm to about 489 nm. In this case, the light emitting layer 140 may be a blue light emitting layer.

Alternatively, each of the first quantum dots 141a and the second quantum dots 142a may emit red light belonging to a fifth wavelength region of about 620 nm to about 680 nm. In this case, the light emitting layer 140 may be a red light emitting layer.

In an embodiment, materials of the first and second quantum dots 141a and 142a are not particularly limited, and known or commercially available quantum dots may be used.

In an embodiment, each of the first quantum dots 141a and the second quantum dots 142a may have a core-shell structure.

In an embodiment, for each of the first quantum dots 141a and the second quantum dots 142a, the core may include a first semiconductor nanocrystal, and the shell may include a second semiconductor nanocrystal having a composition different from the composition of the first semiconductor nanocrystal.

In an embodiment, in the interface between the core and the shell, the shell may have a concentration gradient where a concentration of element(s) in the shell decreases toward the center. In an embodiment, the quantum dots may have a structure (core-single shell structure) including one core and one layer of shell surrounding it. In this case, the single shell structure may have a single composition or concentration gradient.

Alternatively, at least one of the first quantum dots 141a and the second quantum dots 142a may have a structure (core-multishell structure) including one core and a multi-layered shell surrounding the core. Herein, the multi-layered shell structure has a structure of two or more shells, and each layer may have a single composition or an alloy or may have a concentration gradient.

As such, when each of the first quantum dots 141a and the second quantum dots 142a has a core-shell structure (e.g., a core-single shell structure and/or a core-multi-layered shell structure), a material composition constituting the shell may have a larger bandgap energy than a material composition constituting the core, In the case of constructing a multi-layered shell, an outer shell far from the core may have a larger bandgap energy than an inner shell close to the core.

As a result, a more effective quantum confinement may be obtained by using quantum dots having a core-shell structure.

In an embodiment, the first semiconductor nanocrystal included in the core and the second semiconductor nanocrystal included in the shell may independently include a Group II-VI compound that does not include Cd, a Group III-V compound, a Group IV-VI compound, a Group IV element or compound, a Group compound, a Group I-II-IV-VI compound that does not include Cd, or a combination thereof. That is, each of the first and second quantum dots 141a and 142a may be a cadmium-free quantum dot. Like this, when the first and second quantum dots 141a and 142a consist of cadmium-free materials, they have no toxicity compared with a conventional cadmium-based quantum dots and thus are not dangerous and are environmentally-friendly.

The Group II-VI compound may be selected from a binary element compound selected from ZnS, ZnSe, ZnTe, ZnO, HgS, HgSe, HgTe, MgSe, MgS, and a mixture thereof; a ternary element compound selected from ZnSeS, ZnTeSe, ZnTeS, HgSeS, HgTeSe, HgTeS, HgZnS, HgZnSe, HgZnTe, MgZnSe, MgZnS, and a mixture thereof; and a quaternary element compound selected from HgZnTeS, HgZnSeS, HgZnTeSe, and a mixture thereof. The Group II-VI compound may further include a Group III metal.

The Group III-V compound may be selected from a binary element compound selected from GaN, GaP, GaAs, GaSb, AlN, AlP, AlAs, AlSb, InN, InP, InAs, InSb, and a mixture thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, InZnP, and a mixture thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II metal (e.g., InZnP).

The Group IV-VI compound may be selected from a binary element compound selected from SnS, SnSe, SnTe, PbS, PbSe, PbTe, and a mixture thereof; a ternary element compound selected from SnSeS, SnSeTe, SnSTe, PbSeS, PbSeTe, PbSTe, SnPbS, SnPbSe, SnPbTe, and a mixture thereof; and a quaternary element compound selected from SnPbSSe, SnPbSeTe, SnPbSTe, and a mixture thereof. Examples of the Group I-III-VI compound may be $CuInSe_2$, $CuInS_2$, CuInGaSe, and CuInGaS. However, the examples according to the invention are not limited thereto. Examples of the Group I-II-IV-VI compound may be CuZnSnSe and CuZnSnS. However, the examples according to the invention are not limited thereto. Examples of the Group IV compound may be a single substance selected from Si, Ge, and a mixture thereof; and a binary element compound selected from SiC, SiGe, and a mixture thereof.

The binary element compound, the ternary element compound, or the quaternary element compound each exists in a uniform concentration in the particle (i.e., quantum dot) or in partially different concentrations in the same particle.

The first and second quantum dots 141a and 142a may have independently quantum efficiency of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 90%, or even 100%.

In a display, the first and second quantum dots 141a and 142a may have a relatively narrow emission wavelength spectrum so as to improve color purity or color reproducibility. The first and second quantum dots 141a and 142a may have independently a full width at half maximum ("FWHM") of an emission wavelength spectrum of, for example, less than or equal to about 45 nm, less than or equal to about 40 nm, less than or equal to about 35 nm, or less than or equal to or about 30 nm. Within the ranges, color purity or color reproducibility of a device may be improved.

The first and second quantum dots 141a and 142a may independently have an average particle diameter (the longest size of the particle if a non-spherically shaped particle) of about 1 nm to about 100 nm. For example, the first and second quantum dots 141a and 142a may independently have an average particle diameter (the longest size of the particle if a non-spherically shaped particle) of, for example, about 1 nm to about 20 nm, about 1 nm to about 15 nm, about 1 nm to about 14 nm, about 1 nm to about 13 nm, about 1 nm to about 12 nm, about 1 nm to about 11 nm, or about 1 nm to about 10 nm.

In addition, the shapes of the first and second quantum dots 141a and 142a may be general shapes in this art and thus may not be particularly limited. For example, the quantum dots may have a spherical, oval, tetrahedral, pyramidal, cuboctahedral, cylinderical, polyhedral, multi-armed, or cube nanoparticle, nanotube, nanowire, nanofiber, nanosheet, or a combination thereof. The quantum dots may have any cross-sectional shape.

The commercially available quantum dots may be used as the first and second quantum dots 141a and 142a, or the first and second quantum dots 141a and 142a may be synthesized in any method. For example, several nanometer-sized quantum dots may be synthesized according to a wet chemical process. In the wet chemical process, precursors react in an organic solvent to grow crystal particles, and the organic solvent or surfactants for forming ligands may coordinate the surfaces of the quantum dots, controlling the growth of the crystal. Examples of the organic solvent and the surfactants for forming ligands are known.

The organic solvent and the surfactants for forming ligands may be selected appropriately. Examples of the organic solvent may include C6 to C22 primary amine such as hexanedecylamine; C6 to C22 secondary amine such as dioctylamine; C6 to C40 tertiary amine such as trioctylamine; nitrogen-containing heterocyclic compounds such as pyridine; C6 to C40 olefin such as octadecene; C6 to C40 aliphatic hydrocarbon such as hexane, octane, hexanedecane, octadecane, or squalane; aromatic hydrocarbon substituted with a C6 to C30 alkyl group such as phenyldodecane, phenyltetradecane, or phenyl hexanedecane; primary, secondary, or tertiary phosphine (e.g., trioctylphosphine) substituted with at least one (e.g., 1, 2, or 3) C6 to C22 alkyl group; phosphine oxide (e.g. trioctylphosphineoxide) substituted with at least one (e.g., 1, 2, or 3) C6 to C22 alkyl group; C12 to C22 aromatic ether such as phenyl ether, benzyl ether; or a combination thereof.

Examples of the surfactants for forming ligands may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', RPO$(OH)_2$, RHPOOH, RHPOOH (where, R and R' are independently hydrogen, a C1 to C40 substituted or unsubstituted aliphatic hydrocarbon, or C6 to C40 substituted or unsubstituted aromatic hydrocarbon, or a combination thereof, and in each ligand, at least one R is not hydrogen), or a combination thereof, but the invention is not limited thereto.

Since organic solvents coordinated to the surfaces of the quantum dots may affect stability in the device, excess materials (e.g., organic solvents, surfactants for forming ligands, or combinations thereof) that are not coordinated to the surfaces of the nanocrystals may be removed by excessively pouring them into a non-solvent and centrifuging the resultant mixture. Specific examples of the non-solvent include, but are not limited to, acetone, ethanol, and methanol. After removing excess material, the amount of materials coordinated to the surfaces of the quantum dots may be less than or equal to about 50 percentages by weight (wt %), for example, less than or equal to about 30 wt %, less than or equal to about 20 wt %, or less than or equal to about 10 wt % of the weight of the quantum dots. The materials coordinated to the surfaces of the quantum dots may include ligands, organic solvents, or a combination thereof. The materials coordinated to the surfaces of the quantum dots, specifically the ligands, may impart dispersibility to the quantum dots.

In an embodiment, at least a portion of the surfaces of the first and second quantum dots 141a and 142a may have ligands attached thereto. In an embodiment, examples of the ligand may be a compound derived from a metal halide, a compound derived from a carboxylic acid, a compound derived from thiol, or a combination thereof.

The ligand may be chemically bound to the surface of the quantum dots, electrostatic attraction, that is, a dispersing force (e.g., van der Waals bond) may be applied to the surface of the quantum dots, or both binding forms may exist. In an embodiment, the dispersing force may be acting between the ligand and the surface of the quantum dots. For example, when the ligand is a hydrophobic ligand, the hydrophobic ligand may include a moiety to which a dispersing force with the surface of the attached quantum dots is applied and a hydrophobic functional group that imparts hydrophobicity. In an embodiment, examples of the hydrophobic ligand may be a compound derived from a carboxylic acid, a compound derived from thiol, or a combination thereof.

Examples of the hydrophobic moiety may include a C4 to C20 alkyl group, a C4 to C20 alkenyl group, a C4 to C20 alkynyl group, or a combination thereof, and examples of the moiety that forms a bond with the surface of the quantum dots may be a carboxylate (–COC$^-$) moiety, a thiolate (–SH$^-$) moiety, and the like.

In an embodiment, examples of the compound derived from carboxylic acids may include a compound derived from fatty acid such as oleate, stearate, palmitate, and the like. In an embodiment, examples of the compound derived from the thiol may include C6 to C20 aliphatic thiolate.

For example, when the first quantum dots 141a have hydrophobic ligands as described above, the first light emitting layer 141 including the first quantum dots 141a may also exhibit non-polarity as a whole. In addition, the first quantum dots to which the hydrophobic ligands are attached have solvent selectivity with respect to a non-polar solvent, specifically an aliphatic non-polar solvent. Accordingly, even if the first light emitting layer 141 is formed on the hole transport layer 130 having solvent selectivity for the aromatic non-polar solvent by using a solution process, damage to the surface of the hole transport layer 130 by an organic solvent during the formation of the first light emitting layer 141 may be minimized.

However, an embodiment according to the invention is not limited thereto. The second quantum dots 142a may have the aforementioned hydrophobic ligand, and neither of the first and second quantum dots 141a and 142a may have the aforementioned hydrophobic ligand.

For example, at least one surface of the first and second quantum dots 141a and 142a may have a ligand having a lower solubility in an organic solvent than quantum dots having the aforementioned hydrophobic ligands attached thereto. In this case, examples of the ligand may include a compound derived from a metal halide.

The metal halide may include zinc, indium, gallium, magnesium, lithium, or a combination thereof and/or may be in a form of chloride, bromide, iodide, or fluoride. The metal included in the metal halide may be the same as the metal included in the outermost layer of the quantum dots, or may be different from each other.

Specific examples of metal halide may be zinc fluoride, zinc chloride, zinc bromide, zinc iodide, indium fluoride, indium chloride, indium bromide, indium iodide, gallium fluoride, gallium chloride, gallium bromide, gallium iodide, magnesium fluoride, magnesium chloride, magnesium bromide, magnesium iodide, lithium fluoride, a lithium chloride, lithium bromide, lithium iodide, or a combination thereof.

The compound derived from the metal halide may include a moiety that is chemically bound to the surface of the attached quantum dot. Examples of the moiety that forms a bond on the surface of the quantum dots may include a halogen ion moiety (e.g., F$^-$, Cl$^-$, Br, I$^-$). The halogen ion moiety may be strongly bound to the surface of the quantum dots and may passivate the quantum dots (e.g., in place of them) instead of other ligands (e.g., hydrophobic ligands such as oleic acid, etc.) present on the surface of the quantum dots.

The compound derived from the metal halide may be obtained by reacting a metal halide solution on the light emitting layer 141 including quantum dots to which the aforementioned hydrophobic ligand is attached. At least a portion of the hydrophobic ligands attached to the quantum dots may be replaced (or substituted) with the aforementioned halogen ion moiety. A ratio of the hydrophobic ligand attached to the surface of the quantum dots and the compound derived from the metal halide may be variously controlled by adjusting a concentration of the metal halide solution, a reaction time, or the like.

While not wishing to be bound by any theory, the aforementioned hydrophobic ligand may reduce luminous efficiency of quantum dots because the hydrophobic moiety generally acts as a barrier against electron and hole injection. However, in an embodiment, the quantum dots attached to the compound derived from the metal halide may provide improved passivation as well as improved charge injection characteristics compared with the quantum dots attached with the hydrophobic ligand.

In an embodiment, a thickness of the light emitting layer 140, specifically a sum of the thicknesses (i.e., total thickness) of the first and second light emitting layers 141 and 142 may be may vary depending on types and sizes of the first and second quantum dots 141a and 142a included in each of the first and second light emitting layers 141 and 142, and types of ligands attached thereto. However, the thickness of the light emitting layer 140 may be, for example, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, greater than or equal to about 20 nm, greater than or equal to about 25 nm, greater than or equal to about 30 nm, or greater than or equal to about 35 nm. The light emitting layer 140 may include two or more monolayers, for example, three or more monolayers, or four or more monolayers of the quantum dots. The thickness of the light emitting layer 140 may be less than or equal to about 100 nm, less than or equal to about 90 nm, less than or equal to about 80 nm, less than or equal to about 70 nm, less than or equal to about 60 nm, less than or equal to about 50 nm, or less than or equal to about 40 nm. The thickness of the light emitting layer 140 may be, for example, about 10 nm to about 60 nm, about 15 nm to about 60 nm, about 20 nm to about 60 nm, about 25 nm to about 60 nm, or about 25 nm to about 50 nm.

The electroluminescent device 10 according to an embodiment may include quantum dots in a predetermined amount to improve luminous efficiency of the light emitting layer 140.

For example, a total weight of the first and second quantum dots 141a and 142a may be included in an amount of, for example, greater than or equal to about 5 wt %, greater than or equal to about 10 wt %, greater than or equal to about 15 wt %, or greater than or equal to about 20 wt %, and less than or equal to about 98 wt %, less than or equal to about 95 wt %, less than or equal to about 90 wt %, less than or equal to about 85 wt %, less than or equal to about 80 wt %, less than or equal to about 75 wt %, less than or equal to about 70 wt %, less than or equal to about 65 wt %, less than or equal to about 60 wt %, less than or equal to about 55 wt %, or less than or equal to about 50 wt %, for example, about 5 wt % to about 98 wt %, about 20 wt % to about 98 wt %, about 20 wt % to about 90 wt %, about 20 wt % to about 85 wt %, about 50 wt % to about 85 wt %, or about 50 wt % to about 80 wt % based on 100 wt % of the light emitting layer 140.

However, an embodiment according to the invention is not necessarily limited thereto, and the total amount of the first and second quantum dots 141a and 142a in the light emitting layer 140 may be varied depending on amounts of other constituent elements (e.g., a binder, a non-solvent, an organic solvent, etc.) included in the light emitting layer 140, types and/or amounts of the used ligands, materials constituting the first and second quantum dots 141a and 142a, the number of shells and/or shell thickness of the core-shell structure of the first and second quantum dots 141a and 142a, wavelength ranges of the emitted light, thicknesses of the hole transport layer 130, the light emitting layer 140, and/or the electron transport layer 150.

In an embodiment, the first light emitting layer 141 and the second light emitting layer 142 may be separate layers that are distinguished from each other. For example, the first light emitting layer 141 and the second light emitting layer 142 may be distinguished by specific core-shell structures of the first quantum dots 141a and the second quantum dots 142a.

In an embodiment, the first light emitting layer 141 may include the first quantum dots 141a described above. The first light emitting layer 141 may provide holes received from the adjacent hole transport layer 130 to the second light emitting layer 142, and the holes are recombined with electrons to emit light in a predetermined wavelength region using the first quantum dots 141a.

The second light emitting layer 142 is disposed directly on the first light emitting layer 141 and may include the second quantum dots 142a described above. The second light emitting layer 142 may provide electrons received from the adjacent electron transport layer 150 to the first light emitting layer 141, and the electrons are recombined with holes to emit light in a predetermined wavelength region by using the second quantum dots 142a.

In an embodiment, the first quantum dots 141a and the second quantum dots 142a may have core-shell structures that are distinguished from each other. Specifically, the first quantum dots 141a and the second quantum dots 142a may be distinguished from each other in terms of the number of shells, and/or may be distinguished from each other in terms of shell thickness.

Hereinafter, examples of first and second quantum dots 141a and 142a distinguished from each other are described with reference to FIGS. 2 to 5.

Figure 2:
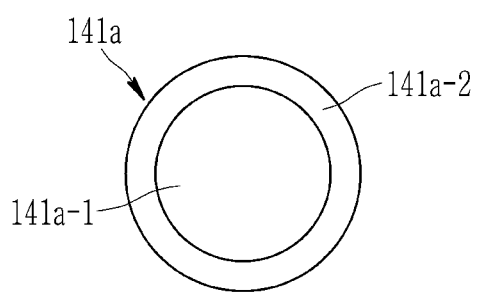
FIGS. 2 and 3 are cross-sectional views showing the first quantum dot (FIG. 2) and the second quantum dot (FIG. 3) of the electroluminescent device according to the first embodiment, respectively.
Figure 3:
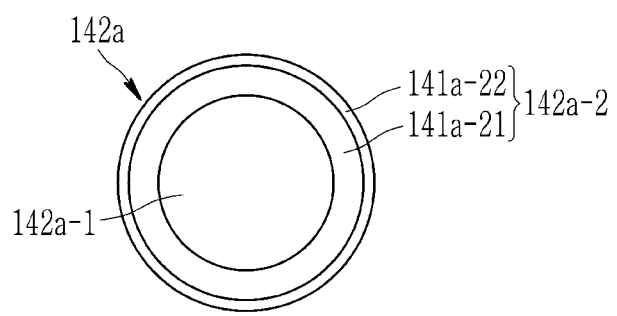

FIGS. 2 and 3 are cross-sectional views showing the first quantum dots (FIG. 2) and the second quantum dots (FIG. 3) of the electroluminescent device according to the first embodiment, respectively.

Referring to FIG. 2, the first quantum dots 141a may include a core 141a-1 and a shell 141a-2 surrounding the surface of the core 141a-1. In an embodiment, the first quantum dots 141a may have a core-single shell structure.

On the other hand, referring to FIG. 3, the second quantum dots 142a may include a core 142a-1 and multiple shells 142a-2 including a first shell 142a-21 surrounding the surface of the core 142a-1 and a second shell 142a-22 surrounding the first shell 142a-21. That is, the second quantum dots 142a may have a core-multishell structure so as to be distinguished from the first quantum dots 141a. In an embodiment, the second quantum dots 142a may have a core-double shell structure.

FIGS. 2 to 3 illustrate an example in which the numbers of shells of the first quantum dots 141a and the second quantum dots 142a are differently controlled in the electroluminescent device according to the first embodiment.

In a first embodiment, each of the first quantum dots 141a and the second quantum dots 142a may emit first light belonging to one of a first wavelength region of about 380 nm to about 489 nm, a second wavelength region of about 490 nm to about 510 nm, a third wavelength region of about 511 nm to about 581 nm, a fourth wavelength region of about 582 nm to about 610 nm, and a fifth wavelength region of about 611 nm to about 680 nm. In this case, an electron transport rate may be very high compared with a hole transport rate inside the electroluminescent device. As a result, electron/hole recombination may occur mainly on the interface between the hole transport layer and the first light emitting layer, and excess electrons may deteriorate the surface of the hole transport layer to decrease a life-span of a device.

While not wishing to be bound by any theory, it is likely that when the number of shells of the quantum dots is relatively small, the quantum dots will exhibit relatively good electron/hole transport capability. Therefore, it may be desirable to configure the first light emitting layer 141 adjacent to the hole transport layer 130 to have a relatively good hole transport capability and the second light emitting layer 142 adjacent to the electron transport layer 150 to have a relatively low electron transport capability so as to suppress electron transport, respectively.

Accordingly, in the electroluminescent device 10 according to the first embodiment, the number of shells of the first quantum dots 141a is adjusted to be smaller than the number of shells of the second quantum dots 142a. For example, when the first quantum dots 141a have a single shell, the second quantum dots 142a may have multiple (double or more) shells. Alternatively, when the first quantum dots 141a have double or multiple (e.g., N−1, where N is an integer of greater than or equal to 4) shells, the second quantum dots 142a may have multiple (N, where N is an integer of greater than or equal to 4) shells.

As a result, each of the hole transport capability per unit area and the electron transport capability per unit area of the first quantum dots may be greater than or equal to the hole transport capability per unit area and electron transport capability per unit area of the second quantum dots. The hole transport capability per unit area and the electron transport capability per unit area may be determined by comparing the current density of each layer (first light emitting layer and second light emitting layer) after applying a voltage above the driving voltage to the electroluminescent device.

Accordingly, when the number of shells of the first quantum dots 141a is adjusted to be smaller than the number of shells of the second quantum dots 142a as in the electroluminescent device 10 according to the first embodiment, the electron/hole transport capability of the first light emitting layer 141 may be improved while the electron transport capability of the second light emitting layer 142 may be suppressed, and thereby it is easy to adjust the electron/hole recombination position to be between the first light emitting layer 141 and the second light emitting layer 142. As such, the electroluminescent device 10 according to the first embodiment may exhibit improved life-span and/or luminescence properties and particularly improved life-span characteristics by adjusting the charge carrier balance.

Figure 4:
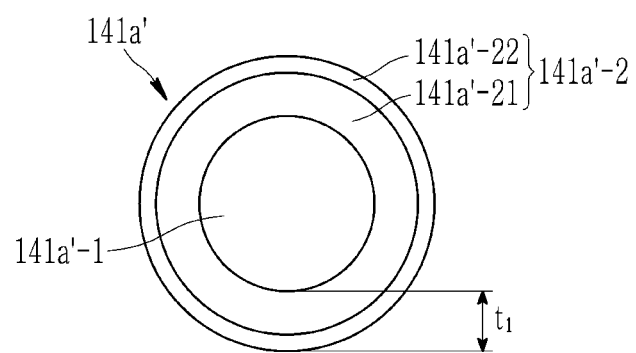
FIGS. 4 and 5 are cross-sectional views showing the first quantum dot (FIG. 4) and the second quantum dot (FIG. 5) of the electroluminescent device according to the second embodiment, respectively.
Figure 5:
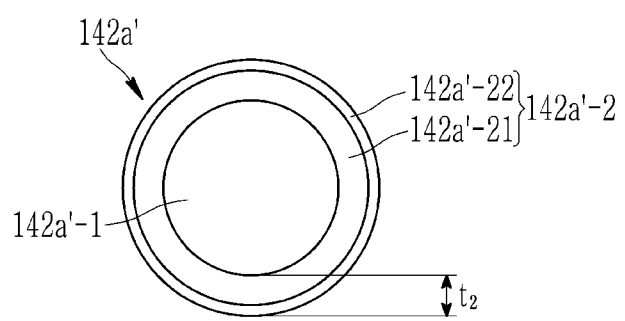

FIGS. 4 and 5 are cross-sectional views showing the first quantum dots (FIG. 4) and the second quantum dots (FIG. 5) of the electroluminescent device according to the second embodiment, respectively.

Referring to FIGS. 4 to 5, the electroluminescent device according to the second embodiment is different from the electroluminescent device according to the aforementioned first embodiment, and is an example of the case where the shell thicknesses of the first quantum dots 141a' and the second quantum dots 142a' are differently adjusted from each other.

Specifically, referring to FIG. 4, the first quantum dots 141a' may include a core 141a'-1 and a shell 141a'-2 surrounding the surface of the core 141a'-1, where the shell 141a'-2 may be a single shell or multiple shells (e.g., a double shell) including a first shell 141a'-21 and a second shell 141a'-22 as illustrated in FIG. 4.

Referring to FIG. 5, the second quantum dots 142a' may include a core 142a'-1 and a shell 142a'-2 surrounding the surface of the core 142a'-1, like the first quantum dots 141a', where the shell 142a'-2 may be a single shell or multiple shells (e.g., a double shell) including a first shell 142a'-21 and a second shell 142a'-22 as illustrated in FIG. 5.

In the second embodiment, each of the first quantum dots 141a and the second quantum dots 142a may emit first light belonging to one of a first wavelength region of about 380 nm to about 489 nm, a second wavelength region of about 490 nm to about 510 nm, and a third wavelength region of about 511 nm to about 581 nm. In this case, although the electron transport rate is slightly faster than the hole transport rate inside the electroluminescent device, both the hole and electron transport rates need to be improved.

While not wishing to be bound by any theory, as the shell thickness of the quantum dots becomes thicker, hole transport capability may increase, and electron transport capability may decrease. Accordingly, it may be desirable to configure the first light emitting layer 141 adjacent to the hole transport layer 130 to have a relatively improved hole transport capability, and to configure the second light emitting layer 142 adjacent to the electron transport layer 150 to have a relatively improved electron transport capability.

Thus, in the second embodiment, a thickness ($t_1$) of the shell 141a'-2 constituting the first quantum dots 141a' may be greater than a thickness ($t_2$) of the shell 142a'-2 constituting the second quantum dots 142a'.

In the second embodiment, the thickness ($t_1$) of the shell 141a'-2 of the first quantum dots 141a' may be, for example, about 1 nm to about 15 nm, or about 5 nm to about 15 nm.

In the second embodiment, the thickness ($t_2$) of the shell 142a'-2 of the second quantum dots 142a' may be, for example, about 1 nm to about 10 nm.

In the second embodiment, each of the first quantum dots 141a' and the second quantum dots 142a' may have a core-multishell structure, where a thickness (a thickness of a single shell in the case of a single shell) of the outermost shell of the first quantum dots 141a' may be larger than a thickness (a thickness of a single shell in the case of a single shell) of the outermost shell of the second quantum dots 142a'. That is, when the first and second quantum dots 141a' and 142a' have multishells, a thickness of the outermost shell of the first quantum dots 141a' may be greater than a thickness of the outermost shell of the second quantum dots 142a' under conditions satisfying the relationship between the aforementioned $t_1$ and $t_2$.

As a result, the hole transport capability per unit area of the first quantum dots 141a' may be greater than or equal to the hole transport capability per unit area of the second quantum dot 142a', and the electron transport capability per unit area of the first quantum dots 141a' may be less than or equal to the electron transport capability per unit area of the second quantum dot 142a'.

Therefore, as in the electroluminescent device according to the second embodiment, when the shell thickness ($t_1$) of the first quantum dots 141a is adjusted to be larger than the shell thickness ($t_2$) of the second quantum dots 142a, it is easy to adjust electron/hole recombination position to be between the first light emitting layer 141 and the second light emitting layer 142, thereby improving the hole transport capability of the first light emitting layer 141 and the electron transport capability of the second light emitting layer 142, respectively. As such, the electroluminescent device according to the second embodiment may exhibit improved life-span and/or luminescence properties by adjusting the charge carrier balance.

In an embodiment, each of the first and second light emitting layers 141 and 142 may include at least one or more monolayers, for example, at least 1.5 or more layers of at least quantum dots.

In the case of the electroluminescent device 10 according to an embodiment, the first and second quantum dots may satisfy at least one of a criteria (i.e., the number of shells) according to the first embodiment and a criteria (i.e., the shell thickness) according to the second embodiment, and the life-span of the device. All of the aforementioned criteria may be satisfied for the purpose of improving the life-span and/or luminescence properties of the device.

An average thickness of each of the first and second light emitting layers 141 and 142 may be varied depending on core-shell structures and materials of the first and second quantum dots 141a and 142a, types of the attached ligands, and different amounts of each light emitting layer, but may be, for example, less than or equal to about 30 nm, less than or equal to about 25 nm, or less than or equal to about 20 nm and for example, greater than or equal to about 5 nm, greater than or equal to about 5 nm 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, or greater than or equal to about 15 nm, for example, about 5 nm to about 30 nm, about 6 nm to about 30 nm, about 6 nm to about 25 nm, about 7 nm to about 25 nm, or about 8 nm to about 25 nm.

In an embodiment, the average thickness of the first light emitting layer 141 may be equal to or greater than the average thickness of the second light emitting layer 142. For example, the average thickness of the first light emitting layer 141 may be greater than the average thickness of the second light emitting layer 142.

In an embodiment, the average thickness of the light emitting layers 140, that is, a total average thickness of each average thickness of the first and second light emitting layers 141 and 142 (i.e., an average of the sum of the thicknesses of the first and second light emitting layers 141 and 142) may be, for example, less than or equal to about 60 nm, less than or equal to about 55 nm, less than or equal to about 50 nm, less than or equal to about 45 nm, or less than or equal to about 40 nm and for example, greater than or equal to about 10 nm, greater than or equal to about 15 nm, greater than or equal to about 20 nm, greater than or equal to about 25 nm, or greater than or equal to about 30 nm, and for example, about 10 nm to about 60 nm, about 10 nm to about 55 nm, about 10 nm to about 50 nm, about 15 nm to about 50 nm, about 15 nm to about 5 nm, or about 15 nm to about 40 nm.

In an embodiment, the electron transport layer 150 may be disposed between the light emitting layer 140 and the second electrode 160 and, for example, directly on the second light emitting layer 142 to transport electrons to the light emitting layer 140.

In an embodiment, a thickness of the electron transport layer 150 may be adjusted in consideration of an electron-hole balance with the hole injection layer 120, the hole transport layer 130, and/or the light emitting layer 140 in the device, but may be, for example, greater than or equal to about 10 nm, greater than or equal to about 15 nm, or greater than or equal to about 20 nm, and for example, less than or equal to about 100 nm, less than or equal to about 90 nm, less than or equal to about 80 nm, less than or equal to about 70 nm, less than or equal to about 60 nm, less than or equal to about 50 nm, or less than or equal to about 40 nm, or for example, about 10 nm to about 100 nm, about 10 nm to about 60 nm, about 10 nm to about 50 nm, about 10 mm to about 40 nm, or about 15 nm to about 40 nm.

When the electron transport layer 150 has a thickness out of the above range, the void, the crack, and the like on the electron transport layer 150 have a more influence on electron transport properties and thus greatly deteriorate device characteristics and hardly accomplish an electron-hole balance with the other constituent elements in the electroluminescent device 10.

In an embodiment, the electron transport layer 150 may be formed of or include an electron-transporting material not emitting light by an electric field and thus not internally quenching electrons.

The electron transport layer 150 may include inorganic material nanoparticles or may be an organic layer formed by deposition. For example, the electron transport layer 150 may include inorganic material nanoparticles, a quinolone-based compound, a triazine-based compound, a quinoline-based compound, a triazole-based compound, a naphthalene-based compound, or a combination thereof.

In an embodiment, the electron transport layer 150 may include inorganic material nanoparticles. The inorganic material nanoparticles may impart electron transport properties to the electron transport layer 150 and do not exhibit light emitting properties. Examples of the inorganic material nanoparticles may be salts of metals including zinc (Zn), magnesium (Mg), tin (Sn), zirconium (Zr), titanium (Ti), aluminum (Al), or a combination thereof.

In an embodiment, the electron transport layer 150 may include two or more inorganic material nanoparticles. In an embodiment, the electron transport layer 150 may include a cluster layer consisting of a plurality of inorganic material nanoparticles. In an embodiment, the electron transport layer 150 may be a cluster layer consisting of two or more inorganic material nanoparticles.

An electron injection layer to facilitate the injection of electrons and/or a hole blocking layer to prevent the movement of holes may be further disposed between the electron transport layer 150 and the second electrode 160.

Thicknesses of the electron injection layer and the hole blocking layer may be selected appropriately. For example, each thickness of the layers may be greater than or equal to about 1 nm or less than or equal to about 500 nm, but the invention is not limited thereto. The electron injection layer may be an organic layer formed by deposition.

The electron injection layer and/or the hole blocking layer may include, for example, at least one selected from 1,4,5,8-naphthalene-tetracarboxylic dianhydride ("NTCDA"), bathocuproine ("BCP"), tris[3-(3-pyridyl)-mesityl]borane ("3TPYMB"), LiF, $Alq_3$, $Gaq_3$, $Inq_3$, $Znq_2$, $Zn("BTZ")_2$, $BeBq_2$, Liq, n-type metal oxide (e.g., ZnO, $HfO_2$, etc.), Bphen, and a combination thereof, but the invention is not limited thereto.

As described above, the electroluminescent device 10 according to an embodiment is configured to have the distinguished core-shell structures of the first and second quantum dots 141a and 142a from each other such that the charge carrier balance inside the device may be easily adjusted, for example, electron/hole recombination position may be adjusted to be between the first light emitting layer 141 and the second light emitting layer 142. As a result, the electroluminescent device 10 according to an embodiment may exhibit improved life-span and/or luminescence properties.

Hereinafter, a display device including the aforementioned electroluminescent device 10 is described.

A display device according to an embodiment includes a substrate, a driving circuit disposed on the substrate, and a first electroluminescent device, a second electroluminescent device, and a third electroluminescent device spaced apart from each other in a predetermined interval and disposed on the driving circuit.

The first to third electroluminescent devices have the same structure as the electroluminescent device 10, but the wavelengths of the lights emitted from each quantum dots may be different from each other.

In an embodiment, the first electroluminescent device may be a red device emitting red light, the second electroluminescent device may be a green device emitting green light, and the third electroluminescent device may be a blue device emitting blue light. In other words, the first to third electroluminescent devices may be pixels expressing red, green, and blue, respectively, in the display device.

However, an embodiment according to the invention is not necessarily limited thereto, but the first to third electroluminescent devices may express magenta, yellow, cyan, or may express other colors, respectively.

One of the first to third electroluminescent devices may be the electroluminescent device 10. For example, the first electroluminescent device displaying red and/or the third electroluminescent device displaying blue may be desirably the aforementioned electroluminescent device 10.

In the display device according to an embodiment, a hole injection layer, a hole transport layer, an electron transport layer, an electron injection layer, and a hole blocking layer except a light emitting layer of each pixel may be integrated to form a common layer. However, an embodiment according to the invention is not limited thereto. A hole injection layer, a hole transport layer, an electron transport layer, an electron injection layer, and a hole blocking layer may be independently disposed in each pixel of the display device, or at least one of a hole injection layer, a hole transport layer, an electron transport layer, an electron injection layer, and a hole blocking layer may form a common layer and remaining layers may form a separate independent layer.

The substrate may be a transparent insulating substrate or may be made of a ductile material. The substrate may include glass or a polymer material in a film having a glass transition temperature (Tg) of greater than about 150° C. For example, it includes a COC (cycloolefin copolymer) or COP (cycloolefin polymer) based material. All the first to third electroluminescent devices are disposed on the substrate. That is, a substrate of the display device according to an embodiment provides a common layer.

The driving circuit is disposed on the substrate and is independently connected to each of the first to third electroluminescent devices. The driving circuit may include at least one line including a scan line, a data line, a driving power source line, a common power source line, and the like, at least two of thin film transistors ("TFT") connected to the wire and corresponding to one organic light emitting diode, and at least one capacitor, or the like. The driving circuit may have a variety of the known structures.

As described above, a display device according to an embodiment may exhibit improved device efficiency and thus improved life-span and luminous efficiency.

Hereinafter, the embodiments are illustrated in more detail with reference to examples. These examples, however, are not in any sense to be interpreted as limiting the scope of the invention.

Verification Example 1

A glass substrate deposited with ITO as a first electrode (an anode) is surface-treated with UV-ozone for 15 minutes, and a PEDOT: PSS solution (HOMO energy level: −5.35 eV, HC Starks) is spin-coated thereon and heat-treated 150° C. for 30 minutes under a nitrogen atmosphere to form a 30 nm-thick hole injection layer. Here, HOMO stands for highest occupied molecular orbital.

On the hole injection layer (TFB, an HOMO energy level: −5.56 eV, a LUMO energy level: −2.69 eV, Sumitomo Co., Ltd.), a solution prepared by dissolving poly[(9,9-dioctylfluorenyl-2,7-diyl-co(4,4'-(N-4-butylphenyl) diphenylamine] in o-xylene is spin-coated and heat-treated at 150° C. for 30 minutes to form a 25 nm-thick first hole transport layer. Here, LUMO stands for lowest unoccupied molecular orbital.

Subsequently, a composition for a light emitting layer, which is prepared by dispersing an InP/ZnSe core-single shell quantum dot to which oleate as a hydrophobic ligand is attached (an average particle diameter: 18 nm, a peak emission wavelength: 630 nm) in octane is coated and heated at 80° C. to form a 20 nm-thick (red) light emitting layer.

On the light emitting layer, a bicarbazole-based compound (GSH0137, Samsung SDI Co.) is deposited to form a 36 nm-thick second hole transport layer.

Subsequently, on the second hole transport layer, 1,4,5,8,9,11-Hexaazatriphenylenehexacar-bonitrile (HAT-CN) is deposited to form a 10 nm-thick hole injection layer ("HIL").

On the hole injection layer (HIL), aluminum is vacuum-deposited to form a 100 nm-thick second electrode and thus produce HOD (Hole Only Device) according to Verification Example 1 (ITO/PEDOT:PSS/TFB/Red QD(InP/ZnSe)/GSH0137/HAT-CN/Ag).

Verification Example 2

HOD (Hole Only Device) according to Verification Example 2 (ITO/PEDOT:PSS/TFB/Red QD (InP/ZnSe/ZnS)/GSH0137/HAT-CN/Ag) is produced according to the same method as Verification Example 1 except that an InP/ZnSe/ZnS core-double shell quantum dot to which oleate as a hydrophobic ligand is attached (an average particle diameter: 18 nm, a peak emission wavelength: 630 nm) is used instead of the InP/ZnSe core-single shell quantum dot to which oleate as a hydrophobic ligand is attached.

Verification Example 3

An ITO-deposited glass substrate as a first electrode (an anode) is surface-treated with UV-ozone for 15 minutes, and a solution for an electron transport layer, which is prepared by dispersing ZnMgO (an average particle diameter: 2 nm to 5 nm) in ethanol, is spin-coated thereon and heat-treated at 80° C. for 30 minutes to form a 20 nm-thick first electron transport layer.

Subsequently, a composition for a light emitting layer, which is prepared by dispersing an InP/ZnSe core-single shell quantum dot to which oleate as a hydrophobic ligand is attached (an average particle diameter: 18 nm, a peak emission wavelength: 630 nm) in octane, is spin-coated and heat-treated at 80° C. to form a 20 nm-thick (red) light emitting layer.

On the light emitting layer, a solution for an electron transport layer, which is prepared by dispersing ZnMgO (average particle diameter: 2 nm to 5 nm) in ethanol, is spin-coated and heat-treated at 80° C. for 30 minutes to form a 20 nm-thick second electron transport layer.

Subsequently, on the second electron transport layer, aluminum is vacuum-deposited to form a 100 nm-thick second electrode and thus produce EOD (Electron Only Device) according to Verification Example 3 (ITO/ZnMgO/Red QD (InP/ZnSe)/ZnMgO/Al).

Verification Example 4

EOD (Electron Only Device) according to Verification Example 4 (ITO/ZnMgO/Red QD (InP/ZnSe/ZnS)/ZnMgO/Al) is produced according to the same method as Verification Example 3 except that an InP/ZnSe/ZnS core-double shell quantum dot to which oleate as a hydrophobic ligand is attached (an average particle diameter: 18 nm, a peak emission wavelength: 630 nm) is used instead of the InP/ZnSe core-single shell quantum dot to which oleate as a hydrophobic ligand is attached.

Evaluation 1: Charge Transport Capability of Red Light Emitting Device

Figure 6:
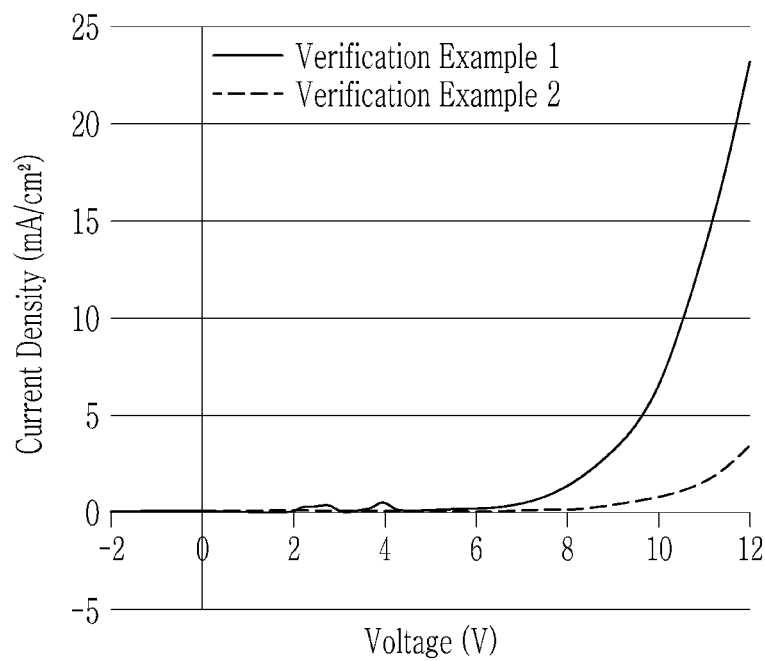
FIG. 6 is a voltage-current density graph of HOD (Hole Only Device) according to Verification Examples 1 to 2.
Figure 7:
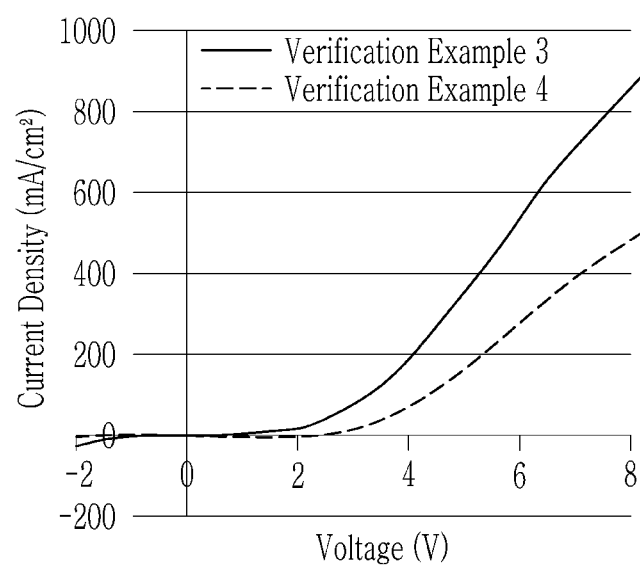
FIG. 7 is a voltage-current density graph of HOD (Hole Only Device) according to Verification Examples 3 to 4.

Voltage-current density of HOD's according to Verification Examples 1 to 2 and EOD's according to Verification Examples 3 to 4 are respectively measured, and the results are shown in FIGS. 6 to 7.

FIG. 6 shows voltage-current density graphs of HOD's (Hole Only Device) according to Verification Examples 1 to 2, and FIG. 7 shows voltage-current density graphs of HOD's (Hole Only Device) according to Verification Examples 3 to 4.

Referring to FIG. 6, Verification Example 1 including the InP/ZnSe core-single shell quantum dot exhibits excellent current density compared with Verification Example 2 including the InP/ZnSe/ZnSeS core-double shell quantum dot.

On the other hand, referring to FIG. 7, Verification Example 3 including the InP/ZnSe core-single shell quantum dot exhibits excellent current density compared with Verification Example 4 including the InP/ZnSe/ZnSeS core-double shell quantum dot.

Considering that current density indicates charge (electron and hole) transport capability per unit area, a red light emitting layer including the InP/ZnSe core-single shell quantum dot has excellent charge (electron and hole) transport capability compared with a red light emitting layer including the InP/ZnSe/ZnSeS core-double shell quantum dot.

Accordingly, in a red light emitting device, the red light emitting layer including the InP/ZnSe core-single shell quantum dot has excellent hole transport capability and thus may be applied as a first light emitting layer neighboring the hole transport layer, and the red light emitting layer including the InP/ZnSe/ZnSeS core-double shell quantum dot has a little low electron transport capability and thus may be applied as a second light emitting layer neighboring the electron transport layer.

Verification Example 5

HOD (Hole Only Device) according to Verification Example 5 (ITO/PEDOT:PSS/TFB/Blue QD (ZnTeSe/ZnSe/ZnS, shell thickness:9 nm)/GSH0137/HAT-CN/Ag) is produced according to Verification Example 1 except that a ZnTeSe/ZnSe/ZnS core-double shell quantum dot to which oleate as a hydrophobic ligand is attached (an average particle diameter: 10 nm to 12 nm, a shell thickness: 9 nm, a peak emission wavelength: 455 nm) is used instead of the InP/ZnSe core-single shell quantum dot to which oleate as a hydrophobic ligand is attached.

Verification Example 6

HOD (Hole Only Device) according to Verification Example 6 (ITO/PEDOT:PSS/TFB/Blue QD (ZnTeSe/ZnSe/ZnS, shell thickness: 5 nm)/GSH0137/HAT-CN/Ag) is produced according to Verification Example 1 except that a ZnTeSe/ZnSe/ZnS core-double shell quantum dot to which oleate as a hydrophobic ligand is attached (an average particle diameter: 10 nm to 12 nm, a shell thickness: 5 nm, a peak emission wavelength: 455 nm) is used instead of the InP/ZnSe core-single shell quantum dot to which oleate as a hydrophobic ligand is attached.

Verification Example 7

EOD (Electron Only Device) according to Verification Example 7 (ITO/ZnMgO/Blue QD (ZnTeSe/ZnSe/ZnS, a shell thickness: 9 nm)/ZnMgO/Al) is produced according to Verification Example 3 except that a ZnTeSe/ZnSe/ZnS core-double shell quantum dot (an average particle diameter: 10 nm to 12 nm, a shell thickness: 9 nm, a peak emission wavelength: 455 nm) is used instead of the InP/ZnSe core-single shell quantum dot to which oleate as a hydrophobic ligand is attached.

Verification Example 8

EOD (Electron Only Device) according to Verification Example 8 (ITO/ZnMgO/Blue QD (ZnTeSe/ZnSe/ZnS, shell thickness: 5 nm)/ZnMgO/Al) is produced according to Verification Example 3 except that a ZnTeSe/ZnSe/ZnS core-double shell quantum dot to which oleate as a hydrophobic ligand is attached (an average particle diameter: 10 nm to 12 nm, a shell thickness: 5 nm, a peak emission wavelength: 455 nm) is used instead of the InP/ZnSe core-single shell quantum dot to which oleate as a hydrophobic ligand is attached.

Evaluation 2: Charge Transport Capability of Blue Light Emitting Device

Figure 8:
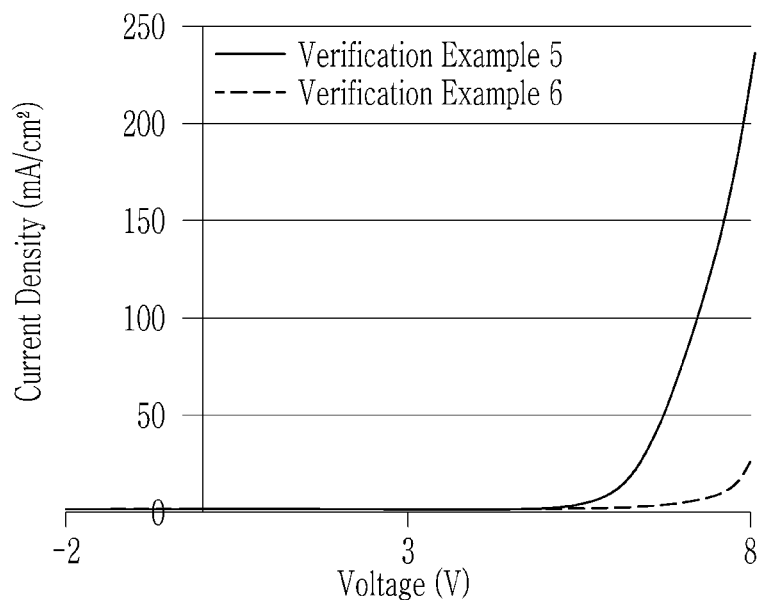
FIG. 8 is a voltage-current density graph of HOD (Hole Only Device) according to Verification Examples 5 to 6.
Figure 9:
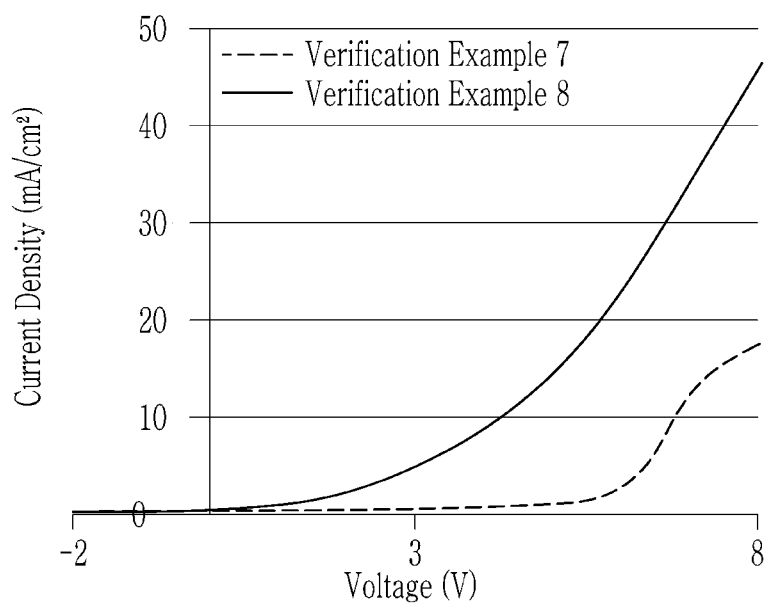
FIG. 9 is a voltage-current density graph of HOD (Hole Only Device) according to Verification Examples 7 to 8.

Voltage-current density of HOD's according to Verification Examples 5 to 6 and EOD's according to Verification Examples 7 to 8 are respectively measured, and the results are shown in FIGS. 8 to 9.

FIG. 8 shows voltage-current density graphs of HOD's (Hole Only Device) according to Verification Examples 5 to 6, and FIG. 9 shows voltage-current density graphs of HOD's (Hole Only Device) according to Verification Examples 7 to 8.

Referring to FIG. 8, Verification Example 5 including a ZnTeSe/ZnSe/ZnS quantum dot having a relatively thick shell exhibits excellent current density compared with Verification Example 6 including a ZnTeSe/ZnSe/ZnS quantum dot having a relatively thin shell.

On the other hand, referring to FIG. 9, Verification Example 8 including a ZnTeSe/ZnSe/ZnS quantum dot having a relatively thick shell exhibits excellent current density compared with Verification Example 7 including a ZnTeSe/ZnSe/ZnS quantum dot having a relatively thick shell.

Considering that current density indicates charge (electron and hole) transport capability per unit area, a blue light emitting layer including a ZnTeSe/ZnSe/ZnS quantum dot having a relatively thick shell exhibits relatively excellent hole transport capability, and a blue light emitting layer including a ZnTeSe/ZnSe/ZnS quantum dot having a relatively thin shell exhibits relatively excellent electron transport capability.

Accordingly, in a blue light emitting device, the blue light emitting layer including the ZnTeSe/ZnSe/ZnS quantum dot having a relatively thick shell exhibits excellent hole transport capability and thus may be applied as a first light emitting layer neighboring the hole transport layer, and the blue light emitting layer including the ZnTeSe/ZnSe/ZnS quantum dot having a relatively thin shell exhibits excellent electron transport capability and thus may be applied as a second light emitting layer neighboring the electron transport layer.

Example 1

A glass substrate deposited with ITO (a work function: −4.850 eV) as a first electrode (an anode) is surface-treated with UV-ozone for 15 minutes, and a PEDOT:PSS solution (an HOMO energy level: −5.35 eV, a LUMO energy level: −2.75 eV, H.C. Starks) is spin-coated and heat-treated 150° C. for 30 minutes under a nitrogen atmosphere to form a hole injection layer having a thickness of 30 nm to 40 nm.

Then, a solution in which poly[(9,9-dioctylfluorenyl-2,7-diyl-co(4,4'-(N-4-butylphenyl) diphenylamine] on the hole injection layer (TFB, HOMO energy level: −5.56 eV, LUMO energy level: −2.69 eV, Sumitomo Co., Ltd.) dissolved in toluene on the hole injection layer and heat-treated at 150° C. for 30 minutes to form a 25 nm-thick first hole transport layer.

On the hole injection layer (HIL), poly[(9,9-dioctylfluorenyl-2,7-diyl-co (4,4'-(N-4-butylphenyl)diphenylamine] (TFB, a HOMO energy level: −5.56 eV, a LUMO energy level: −2.69 eV, Sumitomo Co. Ltd.) is dissolved in toluene, and the solution is spin-coated on the hole injection layer and heat-treated at 150° C. for 30 minutes to form a 25 nm-thick hole transport layer.

Subsequently, a composition for a first red light emitting layer is prepared by adding 150 mg of an InP/ZnSe core-single shell red quantum dot to which oleate as a hydrophobic ligand is attached on the surface (an average particle diameter: 18 nm, a peak wavelength: 630 nm) to 10 mL of octane and stirred the mixture for 5 minutes. Subsequently, the composition for a first red light emitting layer is spin-coated on the hole transport layer and then, surface-washed with ethanol and heat-treated at 80° C. for 30 minutes under a nitrogen atmosphere to form a 20 nm-thick first red light emitting layer.

On the other hand, 15 mg/mL of an InP/ZnSe/ZnS core-double shell red quantum dot to which oleate as a hydrophobic ligand is attached (an average particle diameter: 11 nm to 13 nm, a peak wavelength: about 453 nm) is added to 10 mL of octane and then, stirred for 5 minutes to prepare a composition for a second red light emitting layer.

Subsequently, the composition for a second red light emitting layer is spin-coated on the first red light emitting layer and then, heat-treated at 80° C. for 30 minutes under a nitrogen atmosphere to form a 10 nm-thick second red light emitting layer.

On the second red light emitting layer, a solution for an electron transport layer, which is prepared by dispersing ZnMgO (an average particle diameter: 3 nm, an HOMO energy level: −7.6 eV, a LUMO energy level: −4.3 eV) in ethanol, spin-coated and heat-treated at 80° C. for 30 minutes to form a 20 nm to 25 nm-thick electron transport layer.

On the electron transport layer, aluminum (a work function: −4.3 eV) is vacuum-deposited to form a 100 nm-thick second electrode and thus produce an electroluminescent device according to Example 1 [ITO/PEDOT:PSS/TFB/Red QD (InP/ZnSe)/Red QD (InP/ZnSe/ZnS)/ZnMgO/Al].

Comparative Example 1

An electroluminescent device according to Comparative Example 1 is produced according to the same method as Example 1 except that a composition for a first red light emitting layer instead of the composition for a second red light emitting layer is once more coated on the first red light emitting layer to form a second red light emitting layer.

[ITO/PEDOT:PSS/TFB/Red QD (InP/ZnSe)/Red QD (InP/ZnSe)/ZnMgO/Al].

Evaluation 3: Luminescence and Life-Span Properties of Red Light Emitting Device Luminescence properties of the red electroluminescent devices according to Example 1 and Comparative Example 1 are evaluated, and the results are shown in Table 1 and FIG. 10.

TABLE 1

| | Maximum EQE [%] | Maximum luminance [cd/m²] | EQE @ 5000 nt [%] | EQE@ 10000 nt [%] | EQE@ 50000 nt [%] | Maximum luminous intensity [cd/A] | Driving voltage @5 mA [V] | Luminance @5 mA [Cd/m²] | Peak emission wavelength [nm] | Full width at half maximum (FWHM) [nm] |
|---|---|---|---|---|---|---|---|---|---|---|
| Ex. 1 | 9.9 | 104550 | 9.8 | 9.2 | 6.8 | 11.2 | 2.7 | 536 | 630 | 34 |
| Comp. Ex. 1 | 13.6 | 96020 | 13.0 | 11.7 | 6.7 | 15.8 | 2.9 | 773 | 630 | 35 |

Figure 10:
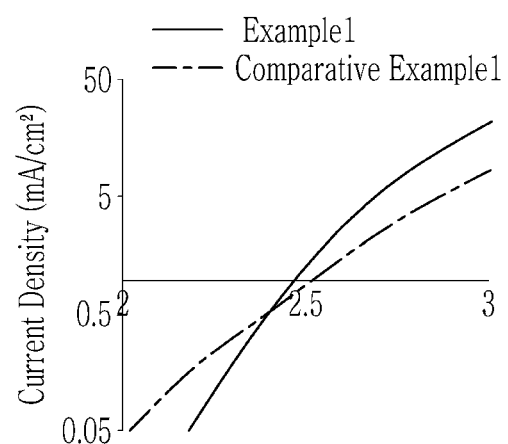
FIG. 10 is a voltage-current density graph of the electroluminescent devices according to Example 1 and Comparative Example 1.

Here, cd/m² is Candela per Square Meter, cd/A is Candela per Ampere, and V is voltages. FIG. 10 shows voltage-current density graphs of the electroluminescent devices according to Example 1 and Comparative Example 1. Referring to Table 1 and FIG. 10, the electroluminescent device of Example 1 exhibits equivalent luminescence properties with that of Comparative Example 1 and particularly, a little low driving voltage compared with that of Comparative Example 1.

Accordingly, referring to the results of Table 1 and FIG. 10, luminescence properties and particularly, a driving voltage of the electroluminescent device may be reduced by adjusting the number of the shells of the core-shell quantum dots included in the dual light emitting layer.

Figure 11:
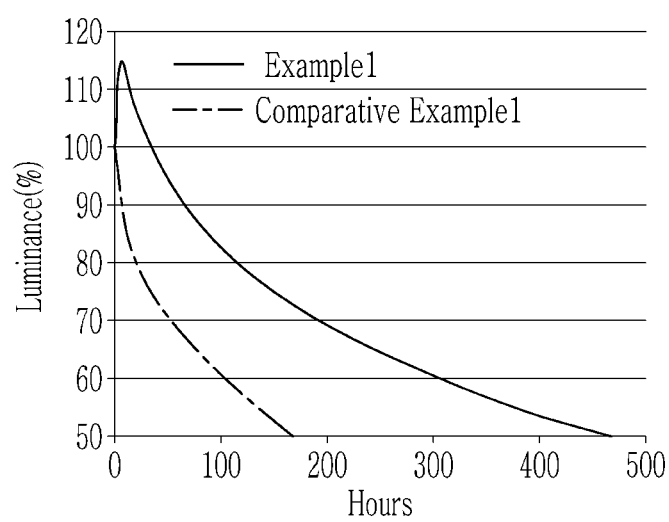
FIG. 11 is a time-luminance graph of the electroluminescent devices according to Example 1 and Comparative Example 1.
Figure 12:
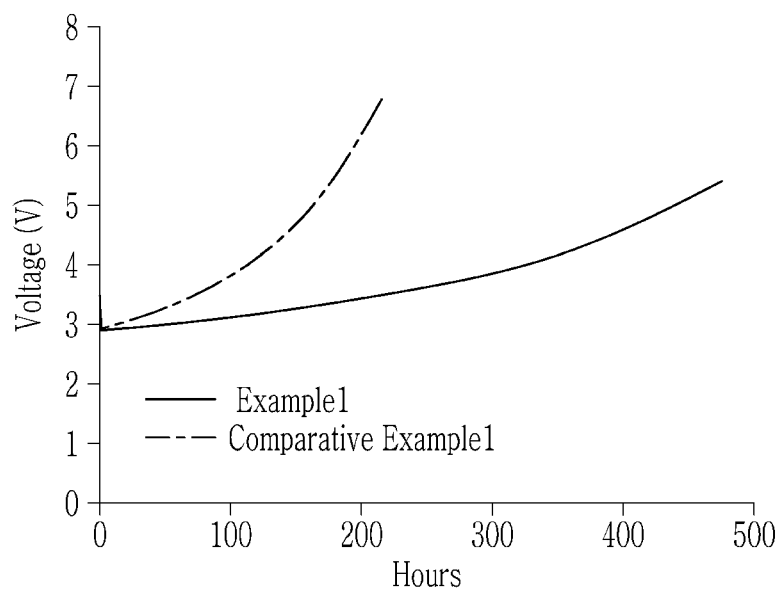
FIG. 12 is a time-voltage graph of the electroluminescent devices according to Example 1 and Comparative Example 1.

On the other hand, life-span characteristics of the electroluminescent devices according to Example 1 and Comparative Example 1 are evaluated, and the results are shown in Table 2 and FIGS. 11 to 12.

TABLE 2

| | T95 [h] | T50 [h] | Current [mA] | Initial P. current [μA] | Initial voltage [V] |
|---|---|---|---|---|---|
| Ex. 1 | 8.34 | 248.9 | 0.409 | 6.061 | 3.2 |
| Comp. Ex. 1 | 1.39 | 165.7 | 0.289 | 5.815 | 3.3 |

In Table 2, T95 and T50 respectively indicate time when 95% (T95) and 50% (T50) of luminance appear relative to initial luminance. On the other hand, in Table 2, Initial P. current is a current value converted from emitted light through a light-receiving sensor (a photodiode) during operation of a device and indicates emitted light intensity of the device. Here, mA is milli-amperes, and μA is microamperes. In other words, the Initial P. current means that the electroluminescent devices of Examples and Comparative Examples are measured with substantially equivalent light intensity.

FIG. 11 shows time-luminance graphs of the electroluminescent devices according to Example 1 and Comparative Example 1, and FIG. 12 shows time-voltage graphs of the electroluminescent devices according to Example 1 and Comparative Example 1.

Referring to Table 2 and FIGS. 11 to 12, the electroluminescent device of Example 1 exhibits relatively reduced device degradation depending on time changes as well as greatly improved T95 and T50 compared with Comparative Example 1 (refer to FIG. 12).

Accordingly, referring to the results of Table 2 and FIGS. 11 to 12, life-span characteristics of the electroluminescent devices may be greatly improved by differently adjusting the number of the shells of the core-shell quantum dots in the dual light emitting layer.

Example 2

A glass substrate deposited with ITO (a work function: −4.850 eV) as a first electrode (an anode) is surface-treated with UV-ozone for 15 minutes, and a PEDOT:PSS solution (an HOMO energy level: −5.35 eV, a LUMO energy level: −2.75 eV, H.C. Starks) is spin-coated and heat-treated at 150° C. for 30 minutes under a nitrogen atmosphere to form a hole injection layer having a thickness of 30 nm to 40 nm.

On the hole injection layer, a solution prepared by dissolving poly[(9,9-dioctylfluorenyl-2,7-diyl-co(4,4'-(N-4-butylphenyl)diphenylamine] (TFB, an HOMO energy level: −5.56 eV, a LUMO energy level: −2.69 eV, Sumitomo Co., Ltd.) in toluene is spin-coated on the hole injection layer and heat-treated at 150° C. for 30 minutes to form a 25 nm-thick hole transport layer.

Subsequently, a composition for a first blue light emitting layer is prepared by adding 150 mg of a ZnTeSe/ZnSe/ZnS core-double shell blue quantum dot to which oleate as a hydrophobic ligand is attached on the surface (an average particle diameter: 10 nm to 12 nm, a shell average thickness: 9 nm, a peak wavelength: 455 nm) to 10 mL of octane and stirring the mixture for 5 minutes. The composition for a first blue light emitting layer is spin-coated on the hole transport layer and heat-treated at 80° C. for 30 minutes under a nitrogen atmosphere to form a 28 nm-thick first blue light emitting layer.

Then, an ethanol solution of zinc chloride (a concentration: 10 mg/mL) is added in a dropwise fashion on the first blue light emitting layer and reacted for one minute to substitute chloride for the oleate adhered to the quantum dot of the first blue light emitting layer. Subsequently, the first blue light emitting layer is dried at 120° C. for 30 minutes under a vacuum condition.

On the other hand, 15 mg/mL of a ZnTeSe/ZnSe/ZnS core-double shell blue quantum dot to which oleate as a hydrophobic ligand is attached on the surface (an average particle diameter: 10 nm to 12 nm, an average shell thickness: 5 nm, a peak wavelength: 455 nm) is added to 10 mL of octane and stirred the mixture for 5 minutes to prepare a composition for a second blue light emitting layer.

Subsequently, the composition for a second blue light emitting layer is spin-coated on the first blue light emitting layer and heat-treated at 80° C. for 30 minutes under a nitrogen atmosphere to form a 13 nm-thick second blue light emitting layer.

On the second blue light emitting layer, a solution for an electron transport layer, which is prepared by dispersing ZnMgO (an average particle diameter: 3 nm, an HOMO energy level: −7.6 eV, a LUMO energy level: −4.3 eV) in ethanol is spin-coated and heat-treated at 80° C. for 30 minutes to form a 20 nm to 25 nm-thick electron transport layer.

Subsequently, on the electron transport layer, aluminum (a work function: −4.3 eV) is vacuum-deposited to form a 100 nm-thick second electrode and thus produce an electroluminescent device according to Example 2 [ITO/PEDOT:PSS/TFB/Blue QD (ZnTeSe/ZnSe/ZnS, a shell thickness: 9 nm)/Blue QD (ZnTeSe/ZnSe/ZnS, a shell thickness: 5 nm)/ZnMgO/Al].

Comparative Example 2

An electroluminescent device according to Comparative Example 2 is produced according to the same method as Example 2 except that the first the composition for a blue light emitting layer instead of the composition for a second blue light emitting layer is once more spin-coated on the first blue light emitting layer to form a second blue light emitting layer.

[ITO/PEDOT:PSS/TFB/Blue QD (ZnTeSe/ZnSe/ZnS, shell thickness: 9 nm)/Blue QD (ZnTeSe/ZnSe/ZnS, shell thickness: 9 nm)/ZnMgO/Al].

Evaluation 4: Luminescence and Life-Span Properties of Blue Light Emitting Device Luminescence properties of the blue electroluminescent devices according to Example 2 and Comparative Example 2 are evaluated, and the results are shown in Table 3 and FIGS. 13 to 14.

TABLE 3

| | Maximum EQE [%] | Maximum luminance [cd/m$^2$] | EQE@ 1000 nt [%] | EQE@ 5000 nt [%] | EQE@ 10000 nt [%] | Maximum luminous intensity [cd/A] | Driving voltage @ 5 mA [V] | Luminance @5 mA [Cd/m$^2$] | Voltage@ 325 nit [V] | Peak emission wavelength [nm] | Full width at half maximum (FWHM) [nm] |
|---|---|---|---|---|---|---|---|---|---|---|---|
| Ex. 2 | 9.4 | 31010 | 9.2 | 7.7 | 6.8 | 7.1 | 3.1 | 352 | 3.0 | 455 | 24 |
| Comp. Ex. 2 | 8.0 | 24210 | 7.7 | 6.6 | 5.7 | 5.9 | 3.1 | 286 | 3.1 | 455 | 24 |

Figure 13:
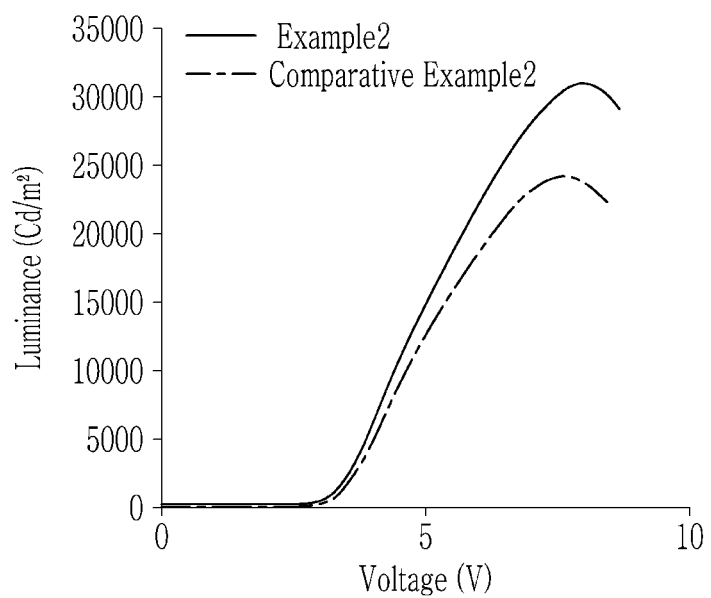
FIG. 13 is a voltage-luminance graph of the electroluminescent devices according to Example 2 and Comparative Example 2.
Figure 14:
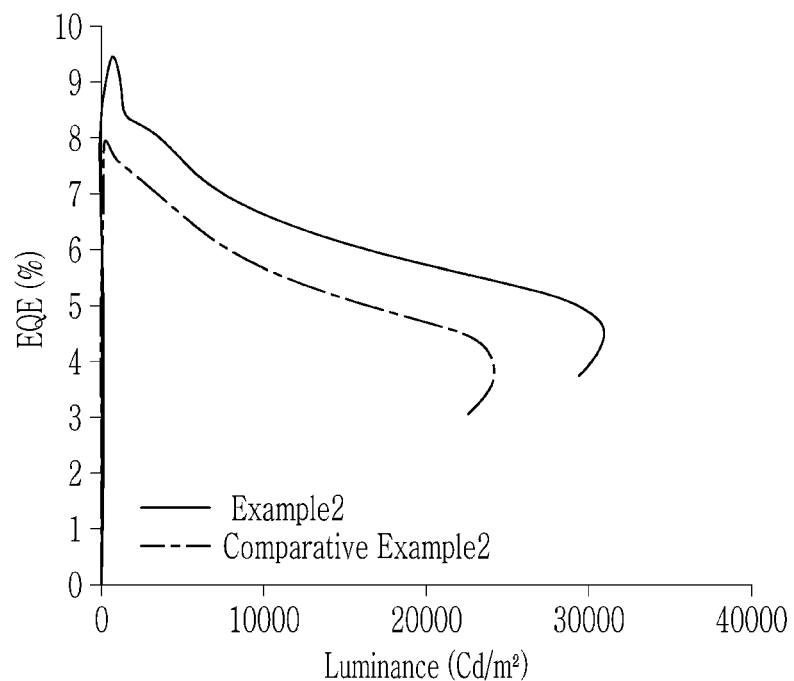
FIG. 14 is a luminance-external quantum efficiency ("EQE") graph of the electroluminescent devices according to Example 2 and Comparative Example 2.

FIG. 13 shows voltage-luminance graphs of the electroluminescent devices according to Example 2 and Comparative Example 2, and FIG. 14 shows luminance-external quantum efficiency (EQE) graphs of the electroluminescent devices according to Example 2 and Comparative Example 2.

Referring to Table 3 and FIGS. 13 to 14, the electroluminescent device of Example 2 exhibits excellent luminescence properties and specifically, external quantum efficiency, luminance, maximum luminous intensity, and the like compared with those of Comparative Example 2.

Accordingly, referring to the results of Table 3 and FIGS. 13 to 14, luminescence properties of the electroluminescent devices may be greatly improved, even though the core-shell quantum dots included in the dual light emitting layer are adjusted to have a different shell thickness.

Figure 15:
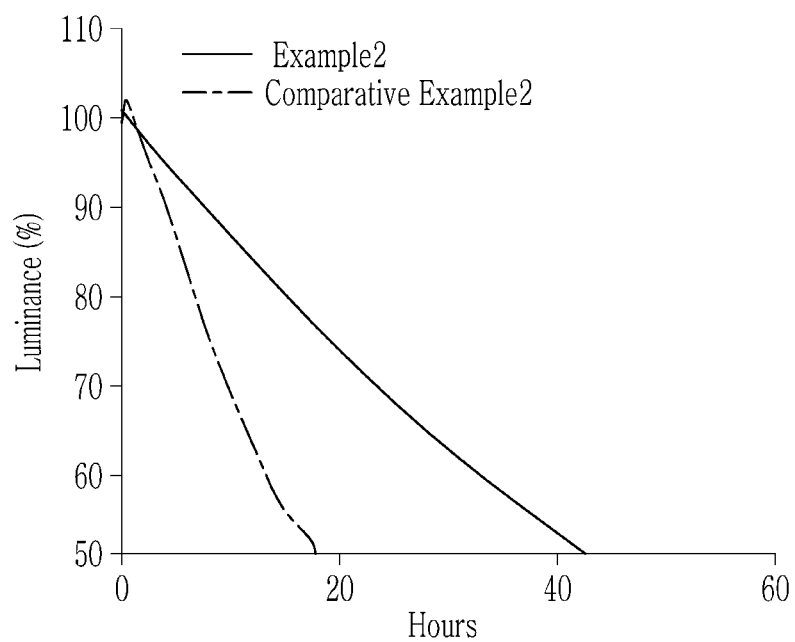
FIG. 15 is a time-luminance graph of the electroluminescent devices according to Example 2 and Comparative Example 2.
Figure 16:
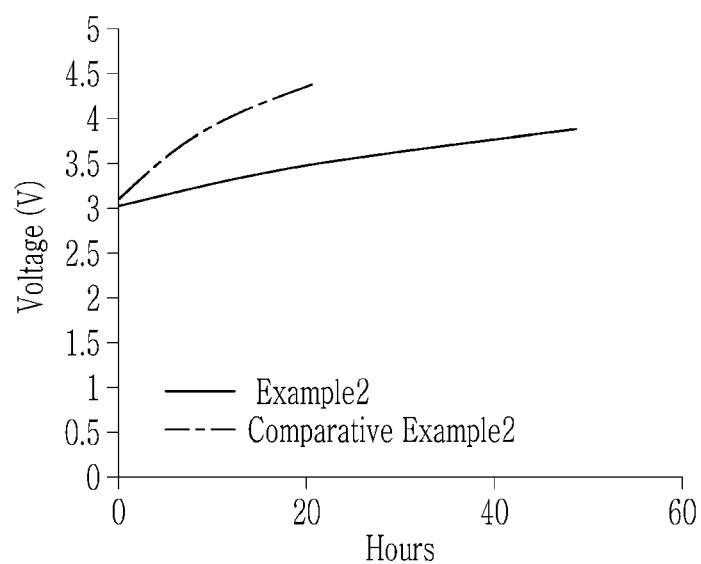
FIG. 16 is a time-voltage graph of the electroluminescent devices according to Example 2 and Comparative Example 2.

On the other hand, life-span characteristics of the electroluminescent devices according to Example 2 and Comparative Example 2 are evaluated, and the results are shown in Table 4 and FIGS. 15 to 16.

TABLE 4

| | T95 [h] | T50 [h] | Current [mA] | Initial P. current [μA] | Initial voltage [V] | Voltage @T50 [V] | Initial voltage − voltage@T50 [V] |
|---|---|---|---|---|---|---|---|
| Ex. 2 | 3.93 | 42.4 | 0.232 | 3.080 | 3.0 | 3.8 | 0.8 |
| Comp. Ex. 2 | 2.57 | 17.7 | 0.270 | 3.055 | 3.1 | 4.3 | 1.2 |

In Table 4, T95, T50, and Initial P. current are equally defined as used in Table 2. FIG. 15 shows time-luminance graphs of the electroluminescent devices according to Example 2 and Comparative Example 2, and FIG. 16 shows time-voltage graphs of the electroluminescent devices according to Example 2 and Comparative Example 2.

Referring to Table 4 and FIGS. 15 to 16, the electroluminescent device of Example 2 exhibits greatly improved T95 and T50 and in addition, relatively small device degradation depending on a time change (refer to FIG. 16) compared with those of Comparative Example 2.

Accordingly, referring to the results of Table 4 and FIGS. 15 to 16, even though the core-shell quantum dots included in the dual light emitting layer are adjusted to have a shell thickness, life-span characteristics of the electroluminescent device are greatly improved.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

| | |
|---|---|
| 10: electroluminescent device | 100: substrate |
| 110: first electrode | 120: hole injection layer |
| 130: hole transport layer | 140: light emitting layer |
| 141: first light emitting layer | 141a: first quantum dot |
| 142: second light emitting layer | 142a: second quantum dot |
| 150: electron transport layer | 160: second electrode |

What is claimed is:

1. An electroluminescent device, comprising
a first electrode and a second electrode which face each other;
a hole transport layer disposed between the first electrode and the second electrode;
a light emitting layer comprising:
a first light emitting layer disposed between the hole transport layer and the second electrode, the first light emitting layer comprising a first quantum dot, and
a second light emitting layer disposed between the first light emitting layer and the second electrode, the second light emitting layer comprising a second quantum dot; and
an electron transport layer disposed between the light emitting layer and the second electrode,
wherein each of the first light emitting layer and the second light emitting layer emits first light,
each of the first quantum dot and the second quantum dot has a core-shell structure, the core-shell structure includes one or more shells, and the first quantum dot and the second quantum dot have different numbers of shells from each other or have different total thicknesses of the one or more shells from each other.

2. The electroluminescent device of claim 1, wherein
the core comprises a first semiconductor nanocrystal, and
the shell comprises a second semiconductor nanocrystal having a composition different from a composition of the first semiconductor nanocrystal.

3. The electroluminescent device of claim 2, wherein the first semiconductor nanocrystal and the second semiconductor nanocrystal independently comprise a Group II-VI compound that does not comprise Cd, a Group III-V compound, a Group IV-VI compound, a Group IV element or compound, a Group compound, a Group I-II-IV-VI compound that does not comprise Cd, or a combination thereof.

4. The electroluminescent device of claim 1, wherein the number of shells of the first quantum dot is less than the number of shells of the second quantum dot.

5. The electroluminescent device of claim 4, wherein the first quantum dot has a core-single shell structure and the second quantum dot comprises a core-multiple shell structure.

6. The electroluminescent device of claim 4, wherein hole transport capability per unit area of the first quantum dot is greater than hole transport capability per unit area of the second quantum dot, and electron transport capability per unit area of the first quantum dot is greater than electron transport capability per unit area of the second quantum dot.

7. The electroluminescent device of claim 1, wherein the total thickness of the one or more shells in the first quantum dot is greater than the total thickness of the one or more shells in the second quantum dot.

8. The electroluminescent device of claim 7, wherein the total thickness of the one or more shells in the first quantum dot is about 1 nanometers (nm) to about 15 nm, and the total thickness of the one or more shells in the second quantum dot is about 1 nm to about 10 nm.

9. The electroluminescent device of claim 7, wherein
each of the first quantum dot and the second quantum dot has a core-multishell structure, and
a thickness of an outermost shell of the multishells of the first quantum dot is greater than a thickness of an outermost shell of the multishells of the second quantum dot.

10. The electroluminescent device of claim 7, wherein the first quantum dot has lower electron transport capability than the second quantum dot.

11. The electroluminescent device of claim 7, wherein
hole transport capability per unit area of the first quantum dot is greater than or equal to hole transport capability per unit area of the second quantum dot, and
electron transport capability per unit area of the first quantum dot is less than or equal to electron transport capability per unit area of the second quantum dot.

12. The electroluminescent device of claim 1, wherein the first light belongs to any one of a first wavelength region of about 380 nm to about 489 nm, a second wavelength region of about 490 nm to about 510 nm, a third wavelength region of about 511 nm to about 581 nm, a fourth wavelength region of about 582 nm to about 610 nm, and a fifth wavelength region of about 611 nm to about 680 nm.

13. The electroluminescent device of claim 1, wherein a ligand comprising a compound derived from a metal halide, a compound derived from a carboxylic acid, a compound derived from a thiol, or a combination thereof is attached to a surface of each of the first quantum dot and the second quantum dot.

14. The electroluminescent device of claim 1, wherein each of the first light emitting layer and the second light emitting layer has an average thickness of about 5 nm to about 30 nm.

15. The electroluminescent device of claim 1, wherein an average thickness of the first light emitting layer is greater than or equal to an average thickness of the second light emitting layer.

16. The electroluminescent device of claim 1, wherein the hole transport layer comprises a poly(3,4-ethylenedioxythiophene) derivative, a poly(styrene sulfonate) derivative, a poly-N-vinylcarbazole derivative, a polyphenylenevinylene derivative, a polyparaphenylenevinylene derivative, a polymethacrylate derivative, a polyarylamine derivative, a polyaniline derivative, a polypyrrole derivative, a poly(9,9-dioctylfluorene) derivative, a poly(spiro-bifluorene) derivative, tris(4-carbazol-9-yl phenyl)amine (TCTA), N,N'-diphenyl-N,N'-bis(3-methylphenyl)-(1,1'-biphenyl)-4,4'-diamine (TPD), N,N'-di(naphthalen-1-yl)-N-N'-diphenyl-benzidine (NPB), tris(3-methylphenylphenylamino)-triphenylamine (m-MTDATA), dipyrazino[2,3-f:2',3'-h]quinoxaline-2,3,6,7,10,11-hexacarbonitrile (HAT-CN), poly-TPD, NiO, $MoO_3$, or a combination thereof.

17. The electroluminescent device of claim 1, wherein the electron transport layer comprises inorganic material nanoparticles, quinolone-based compounds, triazine-based compounds, quinoline-based compounds, triazole-based compounds, naphthalene-based compounds, or a combination thereof.

18. The electroluminescent device of claim 17, wherein the electron transport layer comprises a cluster layer composed of inorganic material nanoparticles.

19. The electroluminescent device of claim 1, wherein a hole injection layer is further included between the first electrode and the hole transport layer.

20. A display device comprising the electroluminescent device of claim 1.

* * * * *